United States Patent
Saigo et al.

(10) Patent No.: US 6,229,558 B1
(45) Date of Patent: May 8, 2001

(54) PRINTER, PRINTING SYSTEM, AND PRINTING METHOD USING PRINT PAPER WITH PHOTOSENSITIVE MICROCAPSULES APPLIED THERETO

(75) Inventors: Tatsuji Saigo; Takashi Maeda; Kazuo Wakabayashi; Kensuke Moritan; Saburo Imai; Shigeru Inagaki; Hidenori Fujioka; Yuji Hosoi, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/094,038

(22) Filed: Jun. 9, 1998

(30) Foreign Application Priority Data

| | | |
|---|---|---|
| Jun. 10, 1997 | (JP) | 9-152719 |
| Nov. 27, 1997 | (JP) | 9-326486 |
| Apr. 14, 1998 | (JP) | 10-102890 |

(51) Int. Cl.[7] ............................................ B41J 2/47
(52) U.S. Cl. ................................. 347/232; 347/172
(58) Field of Search ................... 347/232, 16, 172, 347/37, 175, 130, 131, 138, 236, 238, 242, 246, 263, 183; 355/400, 27, 326 M; 400/203

(56) References Cited

U.S. PATENT DOCUMENTS

| | | | |
|---|---|---|---|
| 4,613,246 | * 9/1986 | Sugiura et al. | 400/320 |
| 4,782,365 | * 11/1988 | Takagi | 355/38 |
| 4,796,036 | * 1/1989 | Misono et al. | 347/232 |
| 4,878,772 | * 11/1989 | Fukumoto et al. | 400/120 |
| 5,021,805 | * 6/1991 | Imaizumi et al. | 347/16 |
| 5,036,266 | * 7/1991 | Burke | 318/646 |

(List continued on next page.)

FOREIGN PATENT DOCUMENTS

| | | |
|---|---|---|
| 424123A2 | 4/1991 | (EP). |
| 501216A1 | 9/1992 | (EP). |
| 6275942 | 5/1987 | (JP). |

(List continued on next page.)

*Primary Examiner*—N. Le
*Assistant Examiner*—Lamson D. Nguyen
(74) *Attorney, Agent, or Firm*—Adams & Wilks

(57) ABSTRACT

A printer has a printer body, a carriage for undergoing scanning movement over a print paper in a scanning direction, and a cassette removably connected to the printer body for storing print paper and having a code element indicative of photosensitive characteristics of the print paper. The print paper contains photosensitive microcapsules encapsulating a color developing material and a photo-curing material and has an image receiving layer for developing color by a reaction of the color developing material with the image receiving layer. The carriage has a light emitting element for emitting light of a preselected wavelength to which the photosensitive microcapsules are exposed to thereby form a latent image on the print paper. A photosensitive characteristics identifying mechanism is disposed on the carriage for reading the code element of the cassette to identify the photosensitive characteristics of the print paper. A light emission controller controls the intensity or the time period of emission of the light emitted by the light emitting element in accordance with the photosensitive characteristics of the print paper identified by the photosensitive characteristics identifying mechanism. A pressurizing mechanism applies mechanical pressure to the print paper after a latent image has been formed thereon to collapse the photosensitive microcapsules which were not exposed to the light emitted by the light emitting element and thereby develop the latent image by reaction of the color developing material in the photosensitive microcapsules with the image receiving layer.

10 Claims, 11 Drawing Sheets

U.S. PATENT DOCUMENTS

| | | | |
|---|---|---|---|
| 5,060,011 | * 10/1991 | Yamamoto et al. | 355/400 |
| 5,066,973 | 11/1991 | Kuwabara | 355/27 |
| 5,202,722 | * 4/1993 | Ohta | 355/400 |
| 5,550,627 | 8/1996 | Dowler et al. | 355/326 M |
| 5,642,146 | * 6/1997 | Uchiyama | 347/130 |
| 5,774,146 | * 6/1998 | Mizutani | 347/16 |

FOREIGN PATENT DOCUMENTS

| | | |
|---|---|---|
| 1113751 | 5/1989 | (JP) . |
| 1185544 | 7/1989 | (JP) . |
| 3140621 | 6/1991 | (JP) . |
| 8272236 | 10/1996 | (JP) . |

* cited by examiner

PRINTER, PRINTING SYSTEM, AND PRINTING METHOD USING PRINT PAPER WITH PHOTOSENSITIVE MICROCAPSULES APPLIED THERETO

BACKGROUND OF THE INVENTION

1. Field of the Invention

The present invention relates to a printer in which a latent image is formed by scanning through a carriage provided with three kinds of light emitting elements consisting red, green, and blue light over print paper onto which photosensitive microcapsules are applied, and by applying a mechanical pressure through a print roller to the print paper with the latent image formed thereon. The present invention also relates to a printing system and a printing method using the printer.

2. Description of the Related Art

Conventional photosensitive microcapsule type print paper is separated into a roll film with microcapsules encaplulating in combination color developing material and photo-curing material applied thereto and a sheet paper with an image receiving layer applied thereto for carrying out developing by bringing the image receiving layer into close contact to the surface of the roll film onto which the microcapsules are applied.

In a printer using this conventional photosensitive microcapsule type print paper, first, the roll film is sent, while a carriage provided with LEDs for applying light scans to apply light from the LEDs so as to correspond to image data to selectively cure which the microcapsules are applied and the image receiving layer of the sheet paper are put together and guided between pressure rollers to apply pressure and collapse microcapsules which were not cured. Further, heating is carried out to accelerate developing of color of the color developing material brought into contact with the image receiving layer to develop an image on the sheet paper. Finally, the roll film is separated from the sheet paper and is wound.

Therefore, in the conventional printer, a cassette containing a stack of a plurality of sheet paper with the image receiving layer applied thereto is inserted into a chassis. Also, the conventional printer is comprised of: a roll film support device to which the roll film with the microcapsules applied thereto is attached; a winding device for winding the roll film; a feed roller to send the roll film; a pickup roller for feeding the sheet paper from the cassette; an exposing means for flickeringly applying the light of specific wavelength to the print paper fed from the cassette corresponding to image data inputted from the external such that microcapsules exposed to the light are made to be uncollapsible; a pressurizing means for applying pressure to the roll film and the sheet paper put together and guided between a pair of pressure rollers to collapse the microcapsules which were not exposed to the light and thus did not cure to be in contact with the image receiving layer thereby causing color developing reaction of the color developing material; a heating means for heating the color developing material which can react with the image receiving layer in contact to develop color thereby accelerating developing of color to develop an image on the print paper; a motor; a power transmitting means for transmitting rotation of the motor to movable elements including the pickup roller and the feed roller; and a controller for controlling the devices.

In order to identify the print paper contained in the cassette as monochrome or full color, or, in order to know the sensitivity of the print paper or the like, paper on which a bar code is printed is put on top of the print paper at the top and is fed, the bar code is read and decoded to specify the kind of the print paper, and the intensity or the time period of application of the light of specific wavelength is varied according to the kind of the print paper.

The conventional printer has the following drawbacks.

(1) Since the print paper is separated into the roll film and the sheet paper, each of the film and the sheet paper has to be supplied and wound independently. Thus, the printer has to be large-sized (desk-top).

(2) Although high-speed pressurization can be possible since the pressurizing means for applying pressure to the print paper is the two rollers, because the two rollers apply pressure in line contact, in order to secure sufficient pressurization power, a chassis has to be thick and large, and at the same time, a member for applying extremely high pressure is necessary. For this reason, the printer has to be considerably heavy and large.

(3) In the case where the cassette is exchanged for another cassette with some of the print paper remaining therein, and then the original cassette is again wanted to be used, since the paper on which the bar code necessary to know the sensitivity is printed can not be fed again, the kind of the print paper can not be specified. Accordingly, it is impossible to exchange a cassette for another cassette with some of the print paper remaining therein, and then the original cassette is again used. As a result, it is necessary to spend all the print paper, and therefore, it is impossible to, for example, carry out sepia printing and then full color printing.

SUMMARY OF THE INVENTION

The present invention is made to solve the problems mentioned in the above of the conventional printer, and therefore has an object of the present invention to provide a printer using print paper with photosensitive microcapsules applied thereto which develops an image by forming a latent image by applying light over the print paper with photosensitive microcapsules applied thereto so as to correspond to image data inputted from the external and applying high pressure thus collapsing microcapsules which were not cured and making color developing material brought into contact with image receiving layer.

Another object of the present invention is to provide a printer which is ultraminiaturized to be palm top.

Still another object of the present invention is to provide a printer with which, even if the cassette is freely exchanged for another cassette with some of the print paper remaining therein, the kind of the print paper can be specified and thus printing can be carried out while the print paper is freely exchanged.

Yet another object of the present invention is to provide a printer in which the developing time can be shortened.

A further object of the present invention is to provide a printer in which displacement of the print paper due to application of pressure can be suppressed to prevent blur of an image and noise caused during printing.

A still further object of the present invention is to provide a printer which can smoothly send the print paper.

A yet further object of the present invention is to provide a printer which, by eliminating deflection of the carriage guided by the carriage guide, can precisely detect the position of the carriage with a linear sensor and can prevent displacement of the position of emission of light, thus preventing a striped pattern and blur of the printed image.

A still further object of the present invention is to provide a printer of lower manufacturing cost by making smaller the number of parts and by facilitating the assembly.

A yet further object of the present invention is to provide a printing system and a printing method using these printers.

In order to attain the above objects, according to an aspect of the present invention, a printer using print paper with photosensitive microcapsules applied thereto uses print paper with photosensitive microcapsules encaplulating color developing material and photo-curing material and an image receiving layer applied thereto for developing color by reacting the color developing material with the image receiving layer, and is comprised of a carriage provided with a light emitting element emitting light of specific wavelength for scanning over the print paper with the light emitting element emitting light to form a latent image on the print paper, a carriage guide for guiding movement of the carriage in the scanning direction and a pressurizing means for applying mechanical pressure to the print paper with a latent image formed thereon to collapse microcapsules which were not exposed to the light of specific wavelength and thus did not cure thereby developing the image by reacting the color developing material in the collapsed microcapsules with the image receiving layer.

According to another aspect of the present invention, a printer using print paper with photosensitive microcapsules applied thereto is comprised of, as the above pressurizing means, a pressure roller which is provided on the carriage and rolls on the print paper guided on a platen by movement of the carriage in the scanning direction, for applying mechanical pressure to collapse microcapsules which were not exposed to the light of specific wavelength and thus did not cure thereby developing the image by reacting the color developing material in the collapsed microcapsules with the image receiving layer.

According to another aspect of the present invention, a printer using print paper with photosensitive microcapsules applied thereto is comprised of a cassette detachably provided on a printer body for containing a stack of the print paper, the cassette being provided with a code indicating photosensitive characteristics of the contained print paper, a photosensitive characteristics identifying means provided on the carriage for reading the code provided on the cassette thereby identifying the photosensitive characteristics of the print paper and a light emission controlling means for controlling the intensity or the time period of emission of the light of specific wavelength based on the photosensitive characteristics of the print paper identified by the photosensitive characteristics identifying means.

It is to be noted that the above structure using the above pressure roller and the structure having the above cassette for containing the print paper may be combined with each other to structure a printer using print paper with photosensitive microcapsules applied thereto.

Further, in each of the above structures, the printer using print paper with photosensitive microcapsules applied thereto is further comprised of a heating means for heating the print paper in the developing process, thereby accelerating the developing speed.

Further, in each of the above structures, the printer using print paper with photosensitive microcapsules applied thereto advantageously is further comprised of a pair of paper guides provided on both end portions of the platen which are, when the print paper is not on the platen, pressed by a spring to bring into close contact to each other, such that the space between them is narrower than the width of the print paper, and, when the print paper is introduced on the platen, the space between which is widened such that both ends of the print paper are held.

Further, in each of the above structures using the pressure roller, the printer using print paper with photosensitive microcapsules applied thereto is advantageously structured such that the space between the pressure roller and the platen is about a half of the thickness of the print paper.

Further, in each of the above structures using the pressure roller, the printer using print paper with photosensitive microcapsules applied thereto can be structured such that the platen is provided being pressed by a spring in the direction of the pressure roller, the pressure roller is formed of a first roller provided at a position facing the platen and a second roller provided so as to be brought into contact with the first roller, the second roller rolls while being brought into contact with the carriage guide, and the first roller rolls between the second roller and the print paper guided onto the platen.

It is to be noted that, in each of the above structures using the first and second rollers, the printer using print paper with photosensitive microcapsules applied thereto is advantageously structured such that, when the print paper is not on the platen, the space between the first roller and the platen is about a half of the thickness of the print paper.

Further, in each of the above structures, the printer using print paper with photosensitive microcapsules applied thereto is further comprised of a driving side timing pulley axially supported, a driven side timing pulley axially supported, a timing belt put around the driving side timing pulley and the driven side timing pulley and provided with a pin to engage with the carriage, and a carriage driving means for driving the driving side timing pulley to rotate, wherein the carriage is engaged with the pin so as to reciprocate in the scanning direction according to rotation of the driving side timing pulley.

Further, in each of the above structures, the printer using print paper with photosensitive microcapsules applied thereto is further comprised of a driving side timing pulley axially supported, a driven side timing pulley axially supported, a timing belt put around the driving side timing pulley and the driven side timing pulley and provided with a pin to engage with the carriage, a first bevel gear provided coaxially with the driving side timing pulley, and a second bevel gear engaged with the first bevel gear, a back surface thereof being supported by a bracket for preventing bevel gear movement, for receiving thrust by the engagement, wherein the carriage is engaged with the pin so as to reciprocate in the scanning direction according to rotation of the driving side timing pulley.

Further, in each of the above structures, in the printer using print paper with photosensitive microcapsules applied thereto, one end portion of the carriage guide fits in and fixed to a rectangular hole in a chassis and the other end portion of the carriage guide is passed through an opening formed in the chassis and is screwed to the chassis.

Still further, according to another aspect of the present invention, a printer using print paper with photosensitive microcapsules applied thereto uses print paper with photosensitive microcapsules encaplulating color developing material and photo-curing material and an image receiving layer applied thereto for developing color by reacting the color developing material with the image receiving layer, and is comprised of a cassette detachably provided on a printer body for containing a stack of the print paper, a pickup roller for feeding said print paper from said cassette, a feed roller for sending the print paper fed by the pickup roller, a motor, a power transmitting means for transmitting rotation of the motor to movable elements including the pickup roller and the feed roller, a carriage provided with a light emitting element emitting light of specific wavelength for scanning over the print paper with the light emitting element emitting light to form a latent image on the print paper, a carriage guide for guiding movement of the carriage in the scanning direction, and a pressurizing means for applying mechanical pressure to the print paper with a latent image formed thereon to collapse microcapsules which were not exposed to the light of specific wavelength and thus did not cure thereby developing the image by reacting the color developing material in the collapsed microcapsules with the image receiving layer.

It is to be noted that, in the structure using the feed roller, the printer using print paper with photosensitive microcapsules applied thereto may further comprise a pinch roller made of plastic material below the feed roller for pinching and sending the print paper.

Further, in each of the structures, the printer using print paper with photosensitive microcapsules applied thereto may be structured such that one side surface of the carriage guide is slidably in contact with one side surface of the carriage, a plate spring is provided on the carriage so as to face the other side surface of the carriage guide, the plate spring being slidably in contact with the other side surface of the carriage guide, and abrasion resistant coating with a small coefficient of friction is provided on the other side surface of the carriage guide.

Further, in the structure using the feed roller, the printer using print paper with photosensitive microcapsules applied thereto is further comprised of a pinch roller below the feed roller for pinching and sending the print paper, a bearing portion provided with notches for bearing at tips of peninsula-shaped portions lifted up from a bottom surface portion of the chassis, and a plate spring portion formed by bending horizontally tips of peninsula-shaped portions lifted up from a plate spring member and further bending the horizontal portions for bearing, said plate spring member being provided with a slit for the bearing portion to go therethrough, the plate spring member being put on the chassis with the bearing portion piercing the slit, the bearing portion supporting lower surfaces of ends of the shaft of the pinch roller, and the plate spring portion pressing upward the ends of said shaft of the pinch roller.

Further, in the structure using the pickup roller and the feed roller, the printer using print paper with photosensitive microcapsules applied thereto is structured such that a cylindrical bearing having a flange in contact with the chassis and L-shaped claws extendedly provided from the flange is provided, a groove into which the claws fit is formed in a circumferential direction at least at one of both ends of a shaft of the pickup roller or the feed roller, the chassis is provided with a bearing containing portion into which the cylindrical bearing is inserted, the cylindrical bearing is inserted into the bearing containing portion, and the shaft is inserted into the cylindrical bearing and the claws are fitted in the groove to make the shaft rotatably supported by the chassis.

Further, according to another aspect of the present invention, a printing system using print paper with photosensitive microcapsules applied thereto comprises the printer as structured in the above and an external device connected with the printer, wherein a signal is transmitted and received between the printer and the external device to carry out printing by the printer.

Further, according to another aspect of the present invention, a printing method using print paper with photosensitive microcapsules applied thereto is comprised of the steps of forming a latent image by scanning of a carriage provided with a light emitting element emitting light of specific wavelength over print paper with photosensitive microcapsules encaplulating color developing material and photo-curing material and an image receiving layer applied thereto for developing color by reacting the color developing material with the image receiving layer, applying mechanical pressure to the print paper with the latent image formed thereon to collapse microcapsules which were not exposed to the light of specific wavelength and thus did not cure, and developing the image by reacting the color developing material in the collapsed microcapsules with the image receiving layer.

Further, according to another aspect of the present invention, a printing method using print paper with photosensitive microcapsules applied thereto is comprised of the steps of inserting into a cassette insert opening a cassette containing a stack of print paper with photosensitive microcapsules encaplulating color developing material and photo-curing material and an image receiving layer applied thereto for developing color by reacting the color developing material with the image receiving layer, identifying the photosensitive characteristics of the print paper by reading a code provided on the cassette indicating the photosensitive characteristics of the print paper, forming a latent image by scanning of a carriage provided with a light emitting element emitting light of specific wavelength over the print paper fed from the cassette case, controlling the intensity or the time period of emission of the light of specific wavelength during the scanning based on the identified photosensitive characteristics of the print paper, applying mechanical pressure to the print paper with the latent image formed thereon to collapse microcapsules which were not exposed to the light of specific wavelength and thus did not cure, and developing the image by reacting the color developing material in the collapsed microcapsules with the image receiving layer.

Still further, in each of the structures, the printing method using print paper with photosensitive microcapsules applied thereto is structured such that, in the developing process, the developing speed is accelerated by heating the print paper.

DETAILED DESCRIPTION OF THE PREFERRED EMBODIMENTS

First Embodiment

Figure 1:
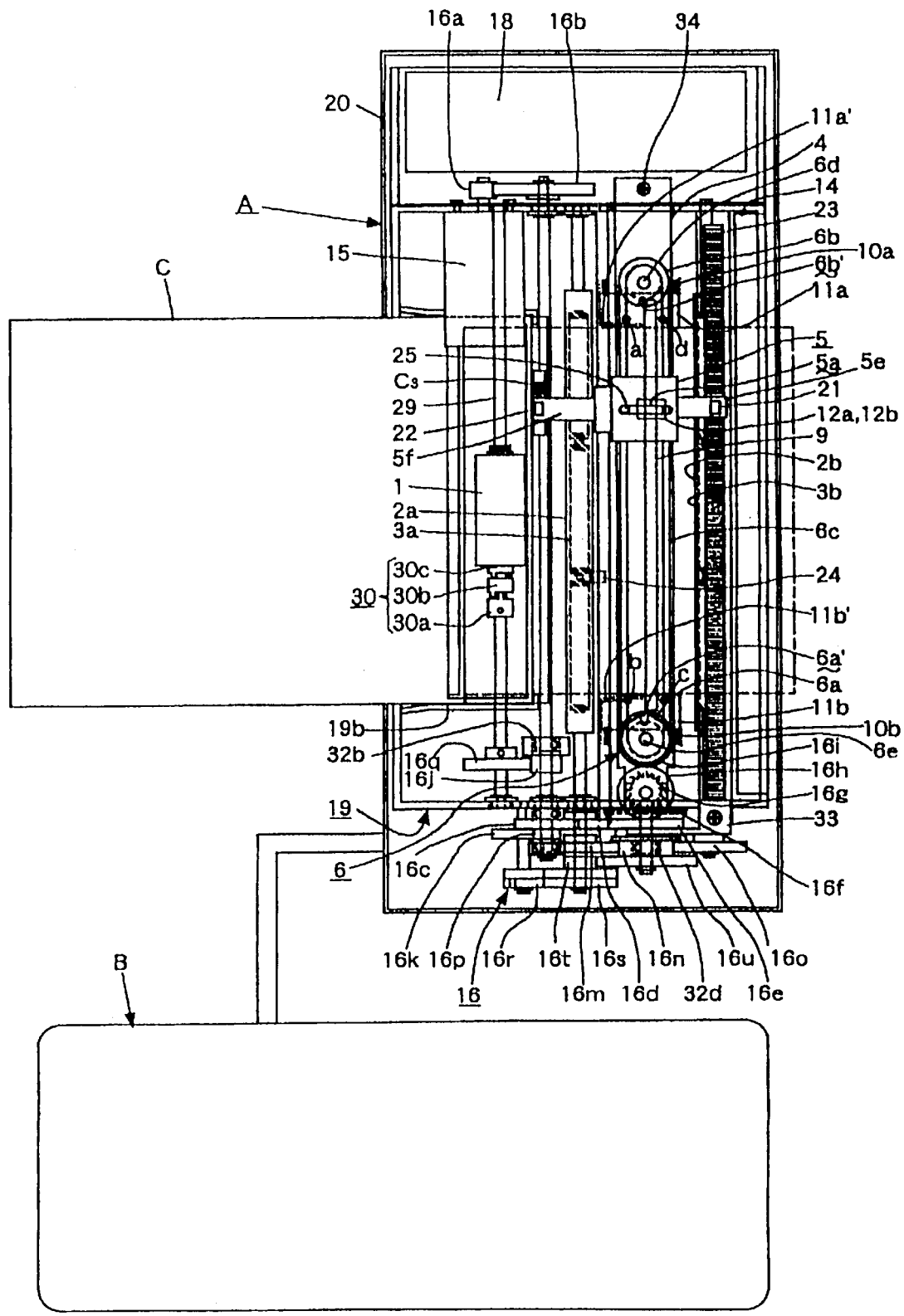
FIG. 1 is a plan view showing a printer and a printing system according to a first embodiment of the present invention.
Figure 2:
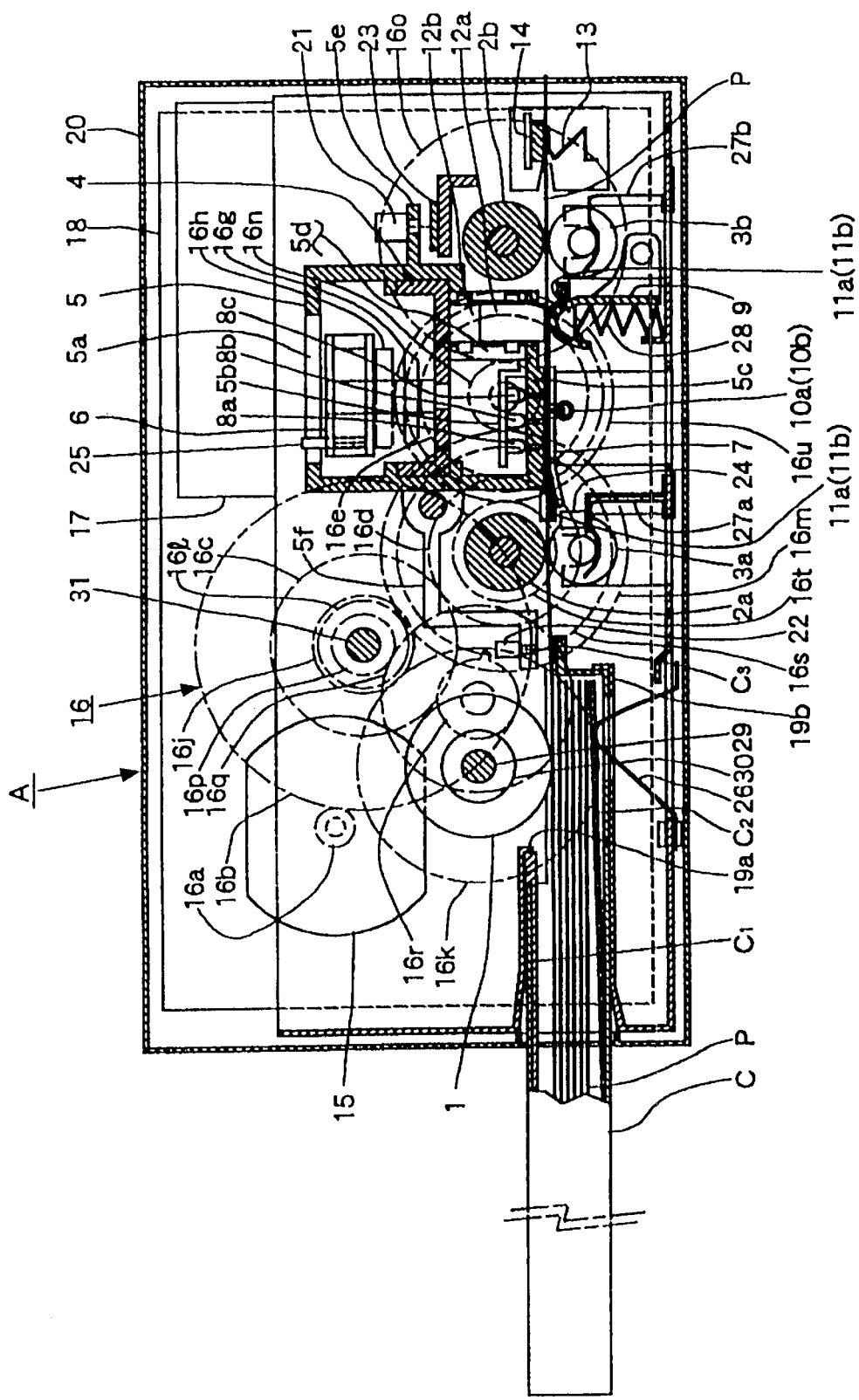
FIG. 2 is an enlarged cross-section viewed from the direction of a side surface of the printer according to the first embodiment of the present invention.
Figure 3:
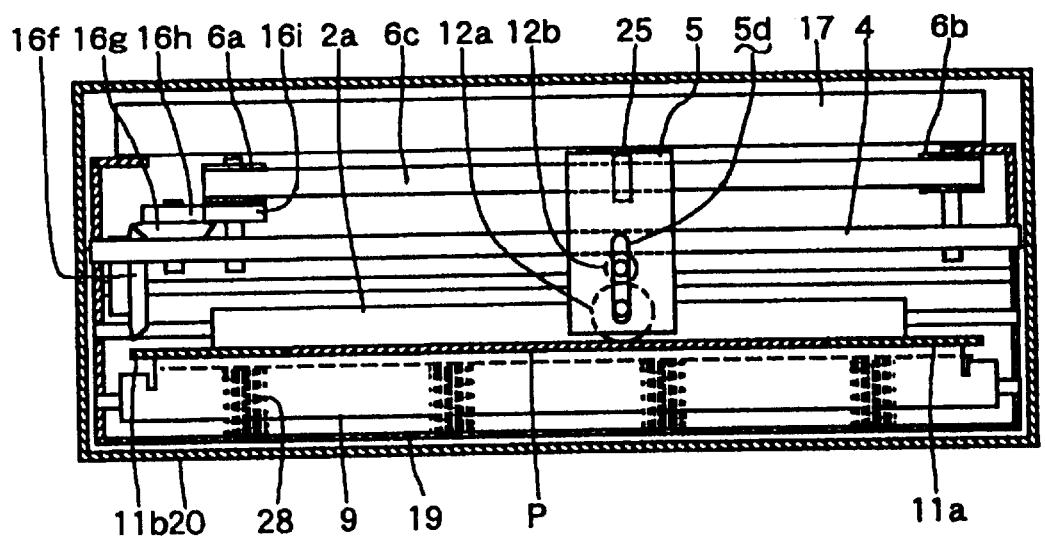
FIG. 3 is a cross-section viewed from the discharge side of print paper of the printer according to the first embodiment of the present invention.

FIG. 1 is a plan view showing a printer and a printing system according to a first embodiment of the present invention. FIG. 2 is an enlarged cross-section viewed from the direction of a side surface of the printer. FIG. 3 is a cross-section viewed from the discharge side of print paper of the printer.

In FIG. 1, reference symbol A denotes a printer, and B denotes a digital camera, and the printer A contains in a cassette C a stack of print paper with photosensitive microcapsules applied thereto, and has a function to feed from the cassette C the print paper sheets one by one for printing. The digital camera B has a function to output an inputted image to an external device via a video output terminal (or a digital output terminal). The printer A and the digital camera B are connected via an interface cable. Here, the mode where the printer A and the digital camera B are connected with each other is referred to as a printing system. In this printing system, image data stored in a memory of the digital camera B is transmitted to the printer A via the interface cable, and printed by the printer A on print paper P contained in the cassette C.

Referring to FIGS. 1–3, the printer A is made up of the following:

(a) a pickup roller 1 for feeding the print paper P from the cassette C;

(b) a feed roller 2a and pinch rollers 3a on the upstream side for intermittently sending the print paper P fed by the pickup roller 1;

(c) a feed roller 2b and pinch rollers 3b on the downstream side;

(d) a carriage guide 4 provided like a beam between the feed rollers 2a and 2b;

(e) a carriage 5 guided by the carriage guide 4 to slide;

(f) a belt disposed around mechanism 6 provided on an upper surface of the carriage guide 4 for reciprocating the carriage 5;

(g) a mounting table 7 for horizontally supporting the print paper P on the downstream side of the pinch rollers 3a on the upstream side.

(h) ten light emitting diodes 8a, 8b, and 8c attached to the carriage 5 for selectively applying light of specific wavelength to the print paper P guided onto the mounting table 7 to form a latent image;

(i) a platen 9 in line contact with the print paper P between the mounting table 7 and the pinch rollers 3b on the downstream side to receive the print paper P from below;

(j) right and left paper guides 11a and 11b provided on the right and on the left of an upper surface of the mounting table 7 and an upper surface of the platen 9 to be pressed by springs 10a and 10b such that the space between them is made narrower;

(k) two rolling rollers 12a and 12b attached to the carriage 5 for rolling on the platen 9 as the carriage 5 scans and moves to pressurize the print paper P, thereby collapsing mirocapsules which were not exposed to the light of specific wavelength and thus did not cure;

(l) a heater 14 provided on the downstream side of the feed roller 2b on the downstream side to be pressed by a plate spring 13 to heat an upper surface of the print paper P to accelerate color developing reaction of color developing material in contact with an image receiving layer;

(m) a linear sensor 21 and a bar code sensor 22 provided on brackets 5e and 5f of the carriage 5;

(n) a scale 23 provided on the heater 14 so as to correspond to the linear sensor 21;

(o) a paper sensor 24 provided between the pinch rollers 3a on the upstream side for detecting a front edge of the print paper P;

(p) a motor 15 for driving the respective movable parts;

(q) a train of gears 16 formed of twenty gears and a one-way clutch;

(r) a controller 17 for controlling the respective portions;

(s) a battery 18 for supplying power to the respective portions;

(t) a chassis 19; and (u) a case 20.

Description of the Structure of the Respective Portions

Next, the respective portions are described in detail.

The train of gears 16 transmits to the movable parts normal rotation and reverse rotation of the motor 15. In particular, by coupling the train of gears 16 and the belt putting around mechanism 6, the carriage 5 can be reciprocated only by continuously rotating the motor 15. At the same time, when the carriage 5 reciprocates around the both ends, the feed rollers 2a and 2b can slightly send the print paper P. By adopting this structure, the operation of the motor 15 can be easily controlled, and thus, an ultraminiaturized palm top printer can be materialized.

When the printer A is turned on, the controller 17 controls the respective portions to operate for the initial adjustment. First, the controller 17 outputs a motor drive signal for driving the motor 15 to rotate counterclockwise. This makes the carriage 5 reciprocate. When a signal as a result of reading the graduation on the scale 23 by the linear sensor 21 attached to the carriage 5 is inputted to the controller 17, the controller 17 carries out operation to detect when a circulating pin 25 connecting a timing belt 6c with the carriage 5 comes to a home position a to stop the output of the motor drive signal. In this operation, at the same time, a signal as a result of reading a bar code C3 attached to the cassette C by a bar code sensor 22 is inputted to the controller 17 and the controller 17 carries out operation to specify the kind of the print paper P contained in the cassette C. According to the kind of the print paper recognized here, the controller 17 selects from a ROM a program for setting the intensity or the time period of application of light from the light emitting diodes 8a, 8b, and 8c.

Next, when an ON signal of a print switch of the printer or the like is inputted, the controller 17 controls the respective portions to operate for preparation for printing. First, the controller 17 carries out operation with regard to image data inputted from the digital camera B to make the data as an electric signal to make the light emitting diodes 8a, 8b, and 8c emit light. Next, the controller 17 outputs a motor drive signal for drive the motor 15 rotate clockwise. This makes the pickup roller 1 and the feed rollers 2a and 2b rotate. First, the pickup roller 1 feeds the print paper P from the cassette C, and then, the feed roller 2a and the pinch rollers 3a pinch the print paper P to be fed. When the paper sensor 24 detects a front edge of the print paper P, according to an inputted detection signal, the controller 17 stops the output of the motor drive signal.

Next, the controller 17 controls the respective portions for operation to carry out printing. As described in the above, immediately after the pickup roller 1 feeds the print paper P from the cassette C, the controller 17 outputs a motor drive signal to drive the motor 15 to rotate counterclockwise, and at the same time, outputs an electric signal corresponding to the image data to the light emitting diodes 8a, 8b, and 8c. The electric signal to make the light emitting diodes 8a, 8b, and 8c emit the light is structured to be outputted synchronously with a signal as a result of reading by the linear sensor 21 of the graduation of the scale 23. The controller 17 finds by operation the amount of sending until a rear edge of the print paper P passes the feed roller 2b on the downstream side by counting the number of times the circulating pin 25 passes the home position, for example. The motor drive signal is adapted to be stopped when it is recognized that sending of a predetermined amount is completed.

The print paper P used in the printer according to the present invention is called as photosensitive microcapsule type print paper. The print paper is formed by evenly applying photosensitive microcapsules having a diameter of about 4 microns to base paper, an image receiving layer including a color developing agent is applied on it, and then it is laminated by a polyester film. The microcapsules are merely minute capsules made of transparent gelatin. The microcapsules themselves transmit light, and have such an strength that they are collapsed by mechanical pressure of a print roller.

Color developing material encapsulated in the microcapsules is transparent leuco dye which develop color when it is brought into contact with the image receiving layer including the color developing agent. As the color developing material, the three primary colors of paint, i.e., magenta (M), yellow (Y), and cyan (C) are prepared so as to correspond to the three primary colors of light, i.e., red (R), green (G), and blue (B). As photo-curing material encapsulated in the microcapsules in combination with the color developing material, material which is cured by light of specific wavelength i.e., light which is complementary to a color that appears when the light developing material is brought into contact with and reacts with the image receiving layer. More specifically, for the color developing material for magenta (M) microcapsules which appears to be reddish purple absorbing green, photo-curing material which cures when green light (G) is applied is selected. Similarly, for the color developing material for yellow (Y) microcapsules which appears to be yellow absorbing bluish purple, photo-curing material which cures when blue right (B) is applied is selected, and, for the color developing material for cyan (C) microcapsules which appears to be bluish purple absorbing red, photo-curing material which cures when red light (R) is applied is selected. Accordingly, there are three kinds of the photosensitive microcapsules, i.e., M, Y, and C. As special print paper, there are print paper for monochrome printing to which only one kind of photosensitive microcapsules are applied, and print paper for full color 256-gradation printing to which the three kinds of photosensitive microcapsules are applied, each of which can be broken down into print paper having high sensitivity and that for low sensitivity. The principle of developing of color of these kinds of special print paper is as follows.

For example, when one kind of light among R, G, and B is selected to be applied to special print paper for full color printing to which the three kinds of photosensitive microcapsules are applied, among the three kinds, i.e., M, Y, and C of the photosensitive microcapsules, only the photosensitive microcapsules in which photo-curing material that is complementary to the selected monochrome light react with the light to be cured, and the other two kinds of microcapsules are not cured. More specifically, when R light is applied, the C photosensitive microcapsules are cured by the reaction of their photo-curing material with the red light, and the other two kinds, i.e., M and Y photosensitive microcapsules are not cured. In this state, when pressure by a roller is applied to the special print paper, while the M and Y photosensitive microcapsules are completely collapsed, the C photosensitive microcapsules are either not collapsed or incompletely collapsed depending on the extent of the curing. Therefore, the M and Y color developing material is brought into contact with the image receiving layer of the special print paper, and that region develops red which is mixture of M and Y. The tone of the red which is mixture of M and Y varies depending on the extent of the curing of the C photosensitive microcapsules, because since, although incompletely, the C photosensitive microcapsules are collapsed, the C color developing material is brought into contact with the image receiving layer. Similarly, when G light is applied, green which is mixture of Y and C develops, and, when B light is applied, blue which is mixture of M and C develops.

To sum up, when one kind of light among R, G, and B is selected and applied to special print paper for full color printing to which the three kinds of photosensitive microcapsules are applied, the region where the selected light is applied develops color which is mixture of M and Y, Y and C, or C and M. When two kinds of light among R. G, and B are selected and applied to the special print paper for full color printing, the region where the selected two kinds of light are applied develops color which corresponds to one among M, Y, or C. The region where none of the three kinds of light is applied develops color which corresponds to all of M, Y, and C, and thus, appears to be black. The tone, saturation, and lightness of the printing is adjusted by adjusting the intensity and the time period of application of the light.

As described in the above, since the photosensitive microcapsules and the image receiving layer are applied in advance to the print paper, it is not necessary to put together and process the film to which microcapsules are applied and a sheet paper to which the image receiving layer is applied during developing, as in the conventional case.

The cassette C contains a stack of, that is, for example, ten sheets of the above-mentioned print paper P, and is detachably provided on the printer A. When in use, the cassette C is inserted into a cassette insert opening opened in a case 1 of the printer A. When the cassette C is inserted into the cassette insert opening, first, a protrusion on a slide door C1 on a top surface of the cassette C touches a claw 19a provided on the chassis 19 to open the slide door C1. Then, a cassette retaining portion 19b provided on the chassis 2 retains the cassette C, a plate spring 26 bent like a mountain and provided on the chassis 2 enters from an opening at the bottom of the cassette C and lifts up a floor plate C2 of the cassette C such that the print paper P closely adheres to the pickup roller 1.

The pickup roller 1 is a rubber roller and is rotatably attached to a shaft 29. When the motor 15 rotates clockwise, the rotation of the shaft 29 is transmitted via a three-piece claw clutch 30 to the pickup roller 1, and thus, the pickup roller 1 rotates in a direction to feed the print paper P.

The three-piece claw clutch 30 is made up of a driving claw 30a fixed to the shaft 29, an intermediate claw 30b rotatably put on the shaft 29 and having claw portions on both sides, and a driven claw 30c provided on the pickup roller 1. When the cassette C is inserted into the case 1, the print paper P moves in the direction of the insertion, gets in touch with the pickup roller 1, and attempts to rotate the pickup roller 1. Since, by adopting the above-mentioned structure, the three-piece claw clutch 30 has play of about one and a half circles with regard to rotation in the direction of feeding paper of the pickup roller 1, when the cassette C is inserted, the pickup roller 1 freely rotates. On the other hand, when the shaft 29 rotates in about one and a half circles, the engagement of the driving claw 30a, the intermediate claw 30b, and the driven claw 30c makes the rotation of the shaft 29 is transmitted to the pickup roller 1.

The feed rollers 2a and 2b are formed by putting and fixing a rubber cylindrical body on a steel shaft body. The pinch rollers 3a and 3b are made of plastic and their shafts and rollers are integrally formed. The pinch rollers 3a are formed of three independent rollers which are coaxially arranged below the feed roller 2a on the upstream side so as to freely rotate, and are pressed by a spring 27b so as to press the feed roller 2a. Similarly, the pinch rollers 3b are arranged below the feed roller 2b on the downstream side and are pressed by the spring 27b so as to press the feed roller 2b.

The belt disposed around mechanism 6 is made up of a driving side timing pulley 6a and a driven side timing pulley 6b which are attached to vertical shafts 6e and 6d, respectively, provided on the carriage guide 4, and the timing belt 6c put around the pulleys 6a and 6b. The circulating pin 25 is provided on the timing belt 6c. The carriage 5 is provided so as to reciprocate in the scanning direction by being guided by the beam-like carriage guide 4. The circulating pin 25 provided on the timing belt 6c is inserted in an elongated hole 5a provided in the carriage 5. When the motor 15 rotates counterclockwise, the rotation of the motor 15 is transmitted via the train of gears 16 to the driving side timing pulley 6a, and the timing belt 6c runs counterclockwise seen in the plan view. Engagement of the carriage 5 with the circulating pin 25 makes the carriage 5 follow the running of the timing belt 6c so as to reciprocate and scan in a direction orthogonal to the sending direction of the print paper P.

By adopting the structure described in the above, continuous rotation of the motor 15 can make the carriage reciprocate. The carriage is capable of printing without intermittently stopping. Further, since U-turns made by the rotating pin 25 at both ends changes the scanning direction of the carriage 5, the inertia force which acts on the carriage 5 can be held down. It is to be noted that the pulleys 6a and 6b are provided with concave portions 6a' and 6b' for escaping from interference with the circulating pin 25.

The carriage 5, the belt disposed around mechanism 6, the rolling rollers 12a and 12b, the two sensors 21 and 22, and a part of the train of gears 16 are assembled to the carriage guide 4. In order to facilitate assembling of the carriage guide 4 structured in this way, an end portion of the carriage guide 4 closer to the driving side timing pulley 6a is engaged with and fixed to a rectangular hole (with no reference numeral), while the other end portion of the carriage guide 4 closer to the driven side timing pulley 6b is passed through an opening formed in the chassis 19 and is screwed to the chassis 19 by a screw 34.

A plate 5b for attaching LEDs is provided on a lower portion of the carriage 5. The light emitting diodes 8a, 8b, and 8c are attached to the plate 5b for attaching LEDs. All of these light emitting diodes are light emitting diodes of high intensity. There are four light emitting diodes 8a disposed which emit light of red wavelength. As described in the above, red light emitted by the light emitting diodes 8a cures the photo-curing material encapsulated together with the color developing material which appears to be cyan in the microcapsules applied to the print paper P. There are three light emitting diodes 8b disposed which emit light of green wavelength. Green light emitted by the light emitting diodes 8b cures the photo-curing material encapsulated together with the color developing material which appears to be magenta. Further, there are three light emitting diodes 8c disposed which emit light of blue wavelength. Blue light emitted by the light emitting diodes 8c cures the photo-curing material encapsulated together with the color developing material which appears to be yellow. Light emitted by these light emitting diodes 8a, 8b, and 8c is applied to the print paper P via a pin hole in a plate 5c. It is to be noted that the number of the light emitting diodes may be varied depending on the required intensity of the light.

The controller 17 carries out operation with respect to image data inputted from the digital camera B taking in consideration the phase shift of the light emitting diodes 8a, 8b, and 8c. The controller 17 also makes the light emitting diodes 8a, 8b, and 8c emit light according to the image data when the circulating pin 25 moves from the home position a to a position b, and from a position c to a position d. Here, the emission of light is controlled to be synchronous with a signal as a result of reading by the linear sensor 21 of the graduation of the scale 23.

The platen 9 and the rolling rollers 12a and 12b forms a pressurizing means for pressurizing a point of the print paper P with high pressure to collapse microcapsules applied to the print paper P.

The platen 9 is disposed so as to be orthogonal to the sending direction of the print paper P, and its portion which is brought into contact with the rolling roller 12a is convex upward in section along the sending direction of the print paper P. Further, the platen 9 is lifted up in the direction of the rolling roller 12a by a spring 28 fixed to the chassis 19. The platen 9 is in point contact with the rolling roller 12a, and the pressure of the spring 28 is adjusted such that the contact pressure is about 800 g.

Shaft portions at both ends of the two rolling rollers 12a and 12b are inserted in a hole longitudinally elongated and provided in a side surface portion of the carriage 5. A lifting force of the platen 9 lifted up by the spring 28 acts on the lower rolling roller 12a. The lifting force is received via the upper rolling roller 12b by the carriage guide 4. Therefore, when the carriage 5 moves, the upper rolling roller 12b is brought into contact with a lower surface of the carriage guide 4 and rolls, and the lower rolling roller 12a smoothly rolls without slippage with respect to the platen 9.

The diameter of the lower rolling roller 12a is large while the diameter of the upper rolling roller 12b is small. While the diameters of the two rolling rollers 12a and 12b may be the same, if the diameter of the lower rolling roller 12a is larger, when the print paper P is not on the platen 9, noise caused when the lower rolling roller 12a transfers from a paper guide 11a or 11b described later to the platen 9 can be held down. It is to be noted that, for the purpose of holding down the noise, a sound absorbing material (not shown) such as plate rubber or sponge is also bonded to the inner surfaces of the case 20.

The paper guides 11a and 11b are provided on the upper surface of the platen 9 at both ends. The paper guides 11a and 11b are substantially as thick as the print paper P, and are, by a stopper not shown, retained such that the space between them is narrower by 2–3 mm than the width of the print paper P and are pressed by springs 10a and 10b in a direction of making narrower the space between them. Further, ribs 11a' and 11b' are provided at edges on the upstream side of the paper guides 11a and 11b, respectively, such that, when the front edges of the print paper P abut against the ribs 11a' and 11b', they wedge open the space between the paper guides 11a and 11b. The paper guides 11a and 11b serve to control the position of the print paper P so as not to displace sideways due to contact resistance of the rolling roller 12a.

The rolling roller 12a reciprocates along the carriage 5 and transfers in succession among the paper guide 11a, the platen 9, and the paper guide 11b. Therefore, when the print paper P is sent on the platen 9, the rolling roller 12a transfers in succession among the paper guide 11a, the print paper P, and the paper guide 11b.

When the print paper P is sandwiched between the platen 9 and the rolling roller 12a, the print paper P can not be sent. In order to solve this problem, during the circulating pin 25 makes a U-turn from the position d to the home position a and from the position b to the position c, the rolling roller 12a is positioned away from the paper guide 11a or 11b. The train of gears 16 has a Geneva gear 16r described later, and a gear tooth of the Geneva gear 16r engages with a gear 16s during the rolling roller 12a is away from the paper guide 11a or 11b as described in the above. In this way, when the print paper P is not sandwiched between the platen 9 and the rolling roll 12a, the rotation of the motor 15 is transmitted to the pickup roller 1 and the feed rollers 2a and 2b such that the feed rollers 2a and 2b slightly send the print paper P.

The rolling roller 12a' except its both ends which do not step onto the print paper P' linearly pressurizes, when the carriage reciprocates, the print paper P to collapse microcapsules which did not cure.

The heater 14 heats the print paper P sent by the feed rollers 2a and 2b between the heater 14 and the plate spring 13. The color developing material in the collapsed microcapsules on the print paper P is brought into contact with the image receiving layer, and is further heated by the heater 14 to accelerate its developing of color. It is to be noted that, though the heater 14 is provided on the downstream side of the feed roller 2b on the downstream side in this embodiment, since the print paper P is overheated if it is left sandwiched between the heater 14 and the plate spring 13, the heater 14 is preferably provided on the upstream side of the feed roller 2b on the downstream side.

Description of Structure and Operation of Train of Gears)

Next, the structure and operation of the train of gears 16 is described in detail.

Figure 4:
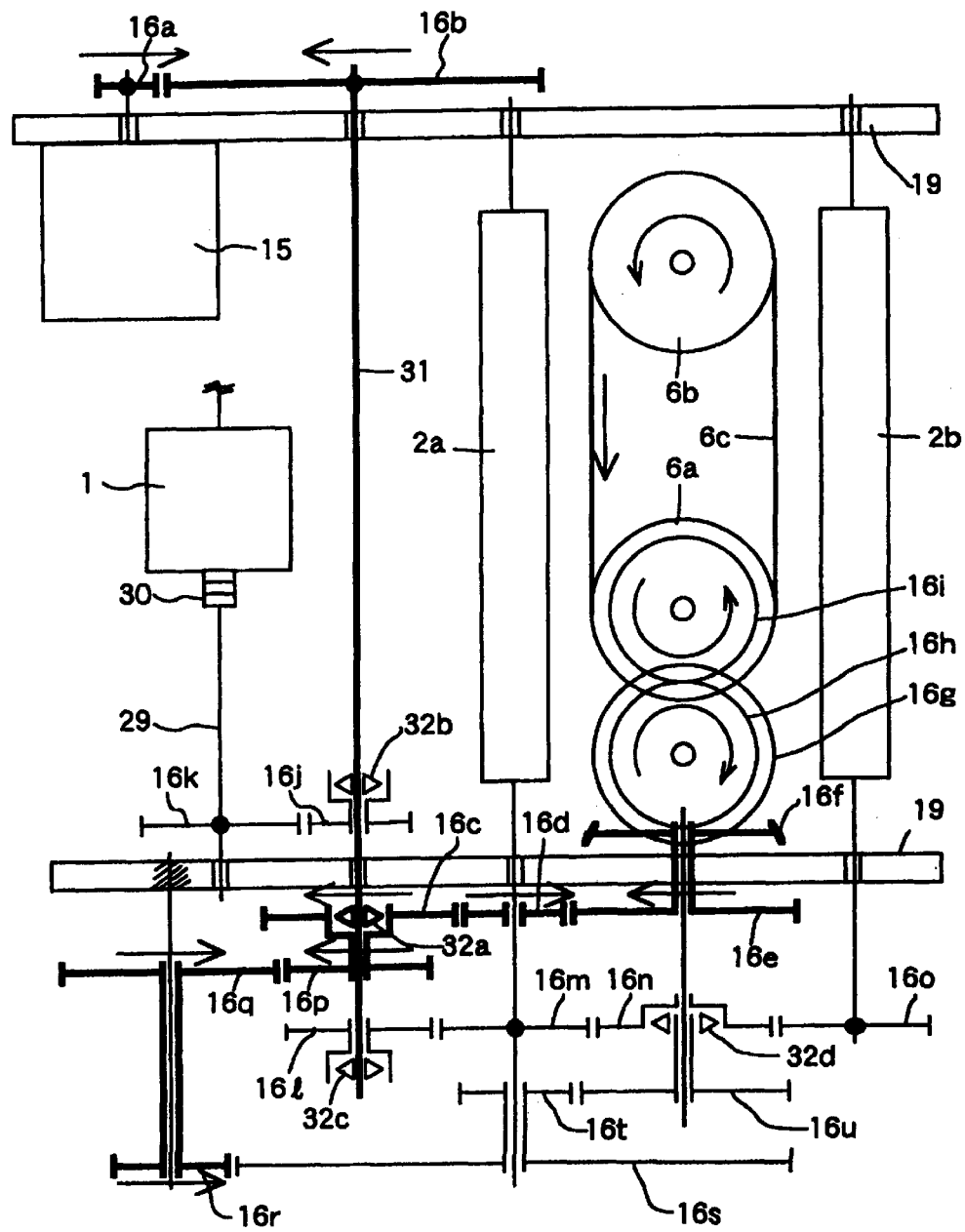
FIG. 4 is a conceptual view for illustrating a first power transmission path of a train of gears adopted in the printer according to the first embodiment of the present invention.

(1) First Power Transmission Path in Initialized State (FIG. 4)

First, when the printer A is turned on, the motor 15 rotates counterclockwise and the carriage 5 goes back and forth once. Here, power is transmitted by the train of gears 16 as in the following.

As shown in FIG. 4, first, the rotation of the motor 15 is transmitted to a shaft 31 by engagement of the gear 16a (the number of teeth: 12) with a gear 16b (the number of teeth: 84). Next, the rotation of the shaft 31 is transmitted via a one-way clutch 32a to a gear 16c (the number of teeth: 30). Then, the rotation of the gear 16c is transmitted by engagement of a gear 16d (the number of teeth: 20) with a gear 16e (the number of teeth: 30) to a bevel gear 16f (the number of teeth: 30) fixed coaxially with the gear 16e. The rotation of the bevel gear 16f is transmitted by its engagement with a bevel gear 16g (the number of teeth: 15) to a gear 16h (the number of teeth: 15) fixedly provided to the bevel gear 16g. Further, the rotation of the gear 16h is transmitted to a gear 16i (the number of teeth: 15). The gear 16i is provided integrally with the driving side timing pulley 6a of the belt putting around mechanism 6, and thus, running of the belt putting around mechanism 6 makes the carriage 5 reciprocate.

Figure 5:
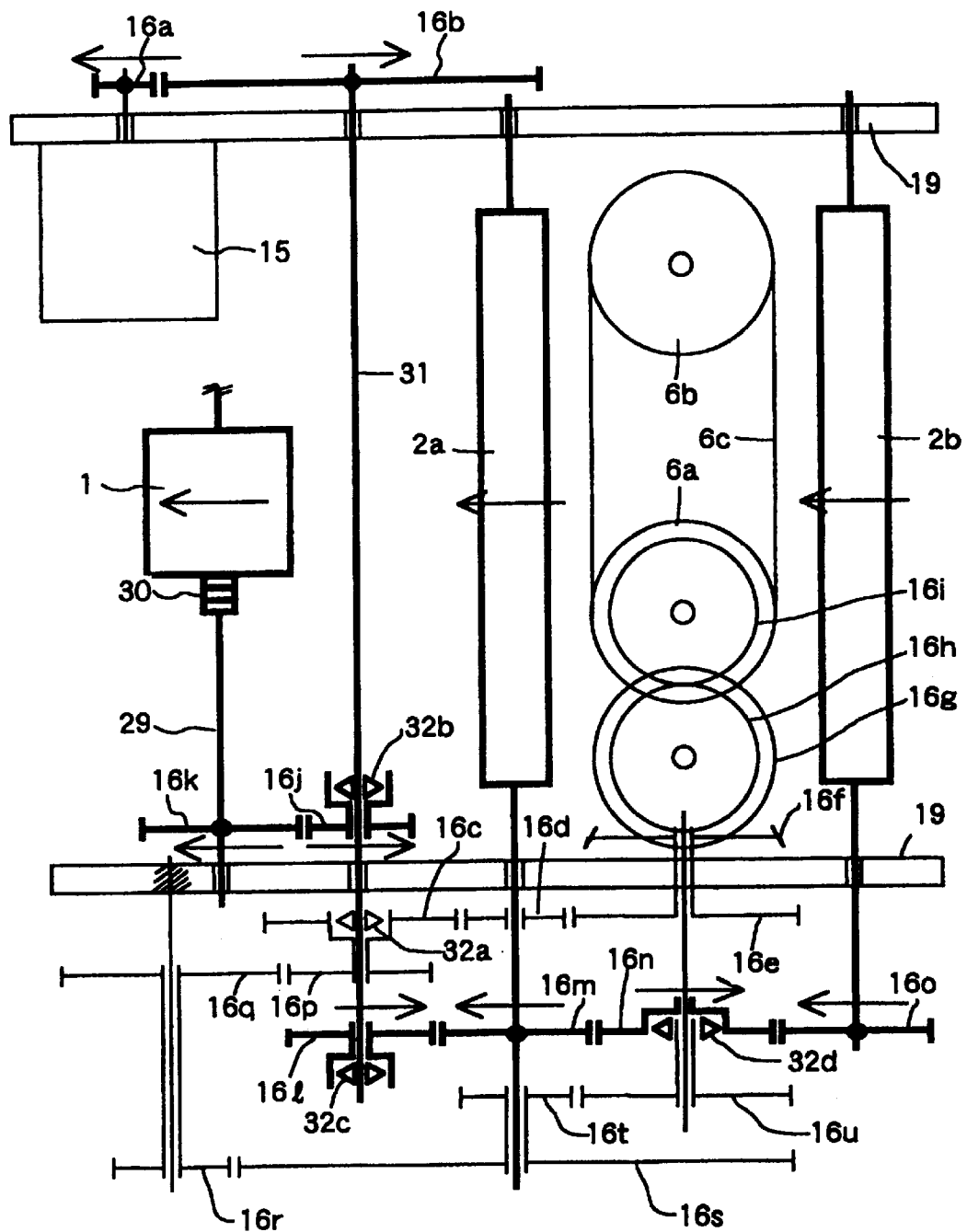
FIG. 5 is a conceptual view for illustrating a second power transmission path of the train of gears adopted in the printer according to the first embodiment of the present invention.

(2) Second Power Iransmission Path Until Print Paper is Fed (FIG. 5)

When the print switch of the printer is turned on, the motor rotates clockwise, and the pickup roller 1 and the feed rollers 2a and 2b rotate. Here, power is transmitted by the train of gears 16 as in the following.

As shown in FIG. 5, first, the rotation of the motor 15 is transmitted to the shaft 31 by engagement of the gear 16a with the gear 16b. Next, the rotation of the shaft 31 is transmitted via a one-way clutch 32b to a gear 16j (the number of teeth: 12). Then, the rotation of the gear 16j is transmitted by its engagement with a gear 16k (the number of teeth: 42) to the shaft 29 of the pickup roller 1. Further, the rotation of the shaft 31 is transmitted via a one-way clutch 32c to a gear 16l (the number of teeth: 19). The rotation of the gear 16l is transmitted by engagement of a gear 16m (the number of teeth: 31), a gear 16n (the number of teeth: 19), and a gear 16o (the number of teeth: 31) to the feed roller 2a fixed coaxially with the gear 16m and to the feed roller 2b fixed coaxially with the gear 16o.

It is to be noted that, when an instruction signal to rapidly send the print paper is inputted, the controller 17 outputs a drive signal of the motor 15 such that power is transmitted by this second power transmission path until discharge of the print paper is completed.

Figure 6:
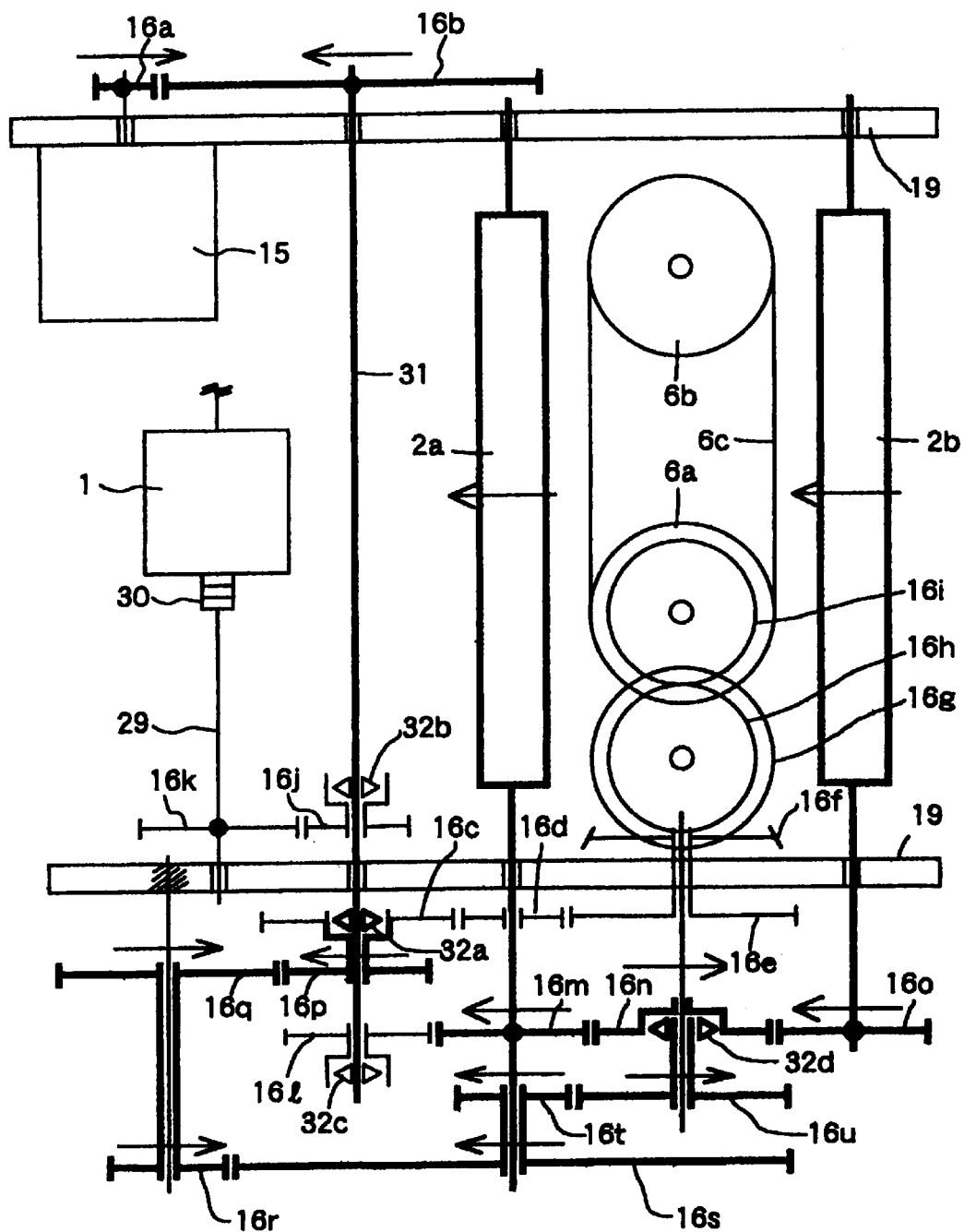
FIG. 6 is a conceptual view for illustrating a third power transmission path of the train of gears adopted in the printer according to the first embodiment of the present invention.

(3) Third Power Transmission Path During Printing (FIG. 6)

After the print paper P is fed by the operation of the above (2), until the printing is completed, the motor 15 again rotates counterclockwise, rotational force is always transmitted to the belt putting around mechanism 6 to continue the reciprocation of the carriage 5. Here, the function of the train of gears 16 for transmitting the rotational force to the belt putting around mechanism 6 is the same as in the case of the first power transmission path described in the above (1).

Here, the power transmission path for transmitting the rotational force to the belt putting around mechanism 6 is not described, and a third power transmission path for transmitting the rotation of the motor 15 to the pickup roller 1 and to the feed rollers 2a and 2b every time the carriage 5 goes to an end and makes a U-turn is described.

As shown in FIG. 6, the rotation of the motor 15 is transmitted to the shaft 31 by engagement of the gear 16a and the gear 16b. Next, the rotation of the shaft 31 is transmitted via the one-way clutch 32a to a gear 16p (the number of teeth: 12). Then, the rotation of the gear 16p is transmitted by its engagement with a gear 16q (the number of teeth: 30) to the Geneva gear 16r *(the number of tooth:* 1) fixed coaxially with the gear 16q. Further, the rotation of the Geneva gear 16r is transmitted to the gear 16s (the number of teeth: 18). Here, since the Geneva gear 16r has only one tooth, every time the Geneva gear 16r rotates in a circle, the gear 16s rotates by an angle for one of its teeth. In this way, the continuous rotation of the Geneva gear 16r is converted into intermittent rotation of the gear 16s. The intermittent rotation of the gear 16s is transmitted to a gear 16t (the number of teeth: 12) fixed coaxially with the gear 16s. Further, the intermittent rotation of the gear 16t is transmitted by its engagement with a gear 16u (the number of teeth: 38) to the gear 16n via a one-way clutch 32d provided between a shaft portion of the gear 16u and a shaft hole of the gear 16n. Then, the intermittent rotation of the gear 16n is transmitted by engagement of the gear 16m with the gear 16o to the feed roller 2a fixed coaxially with the gear 16m and to the feed roller 2b fixed coaxially with the gear 16o. In this way, every time the carriage 5 goes to an end and makes a U-turn, the feed rollers 2a and 2b rotates by a small angle to slightly send the print paper P.

It is to be noted that, with regard to the first power transmission path in the initialized state also, since the rotating direction of the motor 15 is the same as in this case of the third power transmission path, the feed rollers 2a and 2b rotates by a small angle to slightly send the print paper P. However, in the initialized state, since the carriage 5 goes back and forth only once, this sending for once can be neglected.

With reference to FIGS. 1 and 2 again, the train of gears 16 is further described. The train of gears 16 is provided with the pair of the driving side bevel gear 16f and the driven side bevel gear 16g which are engaged with each other at a power transmission branch portion for transmitting the rotational force to the belt putting around mechanism 6. The driven side bevel gear 16g can be unmovably assembled coaxially with the driving side timing pulley 6a. However, the driving side bevel gear 16f can not be firmly assembled to the shaft since it is in proximity to other gears. Therefore, a bracket 33 for preventing bevel gear movement is provided on the chassis 19 so as to be in contact with a back surface of the driving side bevel gear 16f, such that the driving side bevel gear 16f is prevented from coming out of the shaft due to reaction force when it transmits the rotation to the driven side bevel gear 16g.

Next, operation of the printer according to the present invention is described putting in order what are described in the above.

First, when the printer is turned on, the motor 15 rotates counterclockwise. The rotation of the motor 15 is transmitted via the first power transmission path of the train of gears 16 to the belt putting around mechanism 6. Running of the belt putting around mechanism 6 makes the carriage 5 reciprocate. During this reciprocation, the bar code sensor 22 reads the bar code C3 attached to the cassette C to specify the kind of the print paper P contained in the cassette C. The information with regard to the kind of the print paper specified here is used during printing to control the intensity or the time period of emission of light emitted from the light emitting diodes 8a, 8b, and 8c. Since the position of the carriage 5 is always detected by the linear sensor 21, when the carriage 5 returns to the home position, that state is detected and the rotation of the motor 15 is stopped.

Next, when the print switch of the printer is turned on, the motor 15 rotates clockwise. The rotation of the motor 15 is transmitted via the second power transmission path of the train of gears 16 to the pickup roller 1 and the feed rollers 2a and 2b. The pickup roller 1 feeds the print paper P from the cassette C. The fed print paper P is pinched by the feed roller 2a and the pinch rollers 3a and further fed. When the paper sensor 24 detects the front edge of the print paper P, the rotation of the motor 15 is stopped.

Next, the motor 15 rotates counterclockwise again. The rotation of the motor 15 is transmitted via the first power transmission path of the train of gears 16 to the belt putting around mechanism 6. Running of the belt putting around mechanism 6 makes the carriage 5 reciprocate. At the same time, the rotation of the motor 15 is transmitted via the third power transmission path of the train of gears 16 to the pickup roller 1 and the feed rollers 2a and 2b.

During reciprocation of the carriage 5' i.e., during linear movement of the circulating pin 25 from the home position a to the position b, and from the position c to the position d, the light emitting diodes 8a, 8b, and 8c apply light to the print paper P correspondingly to the image data to form a latent image on the print paper. Here, at the same time, the rolling roller 12a linearly pressurizes the print paper P to collapse the microcapsules which were not cured, thereby carrying out developing.

On the other hand, while the carriage 5 is at either end, i.e., while the circulating pin 25 makes a U-turn from the position b to the position c, and from the position d to the home position a, the feed rollers 2a and 2b slightly sends the print paper P.

The heater 14 heats the print paper P between the heater 14 and the plate spring 13. The color developing material in the collapsed microcapsules on the print paper P is brought into contact with the image receiving layer, and is further heated by the heater 14 to accelerate its developing of color.

The operation described in the above is repeated to carry out printing with regard to the hole surface of the print paper P.

Second Embodiment

Figure 7:
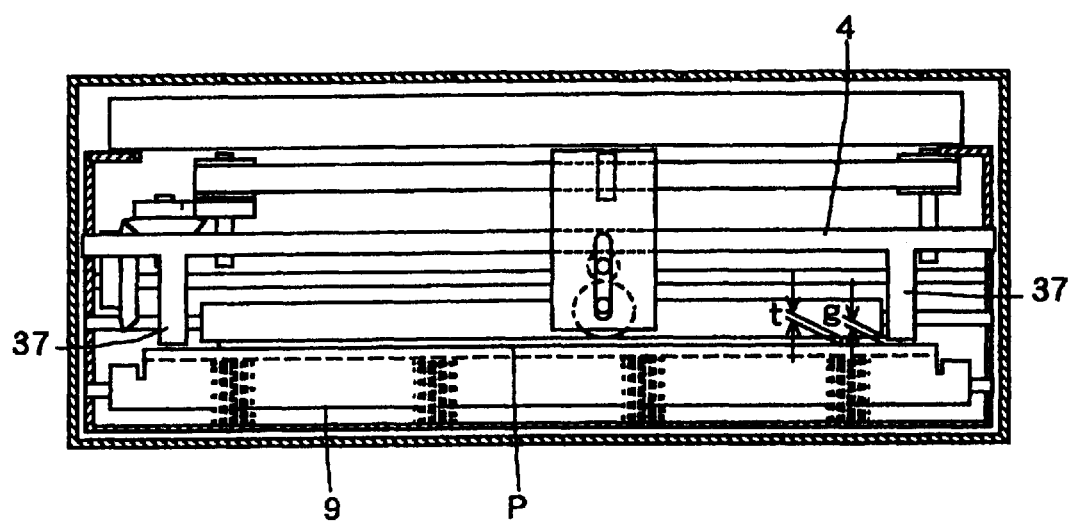
FIG. 7 is a cross-section viewed from the discharge side of print paper of a printer according to a second embodiment of the present invention.

Next, a printer as a second embodiment of the present invention is described. FIG. 7 is a sectional view of the printer taking along the same line as that in FIG. 3. The printer of the second embodiment differs from the printer of the first embodiment in that, while the printer of the first embodiment has the paper guides 11a and 11b, the printer of the second embodiment does not have the paper guides 11a and 11b but has a stopper 37 for restricting a rise of the platen 9.

More specifically, in the printer of the second embodiment, space g between the platen 9 and the rolling roller 12a is about a half of thickness t of the print paper P. Accordingly, even the print paper P is not on the platen 9, the rolling roller 12a is not brought into contact with the platen 9. Further, when the print paper P is on the platen 9, the difference in height when the rolling roller 12a steps onto the print paper P is about a half of the thickness of the print paper P, and since the shock at stepping onto the print paper P is small, the rolling roller 12a does not jump. In this structure also, the function to pressurize the print paper P is the same as that in the first embodiment described in the above.

Though, in this embodiment, the stopper 37 is a protrusion provided so as to hang down from the carriage guide 4, it may be a screw or the like attached to the carriage guide 4. Further, the stopper may be provided on the side of the platen.

The printer as the second embodiment is completely the same as the structure shown in FIGS. 1 to 6 except that it does not have the paper guides 11a and 11b but it has the stopper 37 for restricting a rise of the platen 9, and thus, no additional drawing is prepared except FIG. 7.

Third Embodiment

Figure 8A:
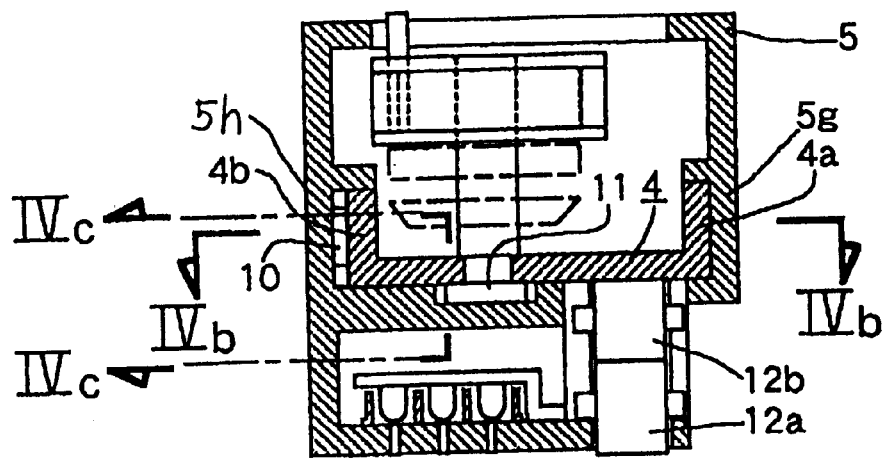
FIG. 8A is a partial enlarged sectional view showing the state of contact of a carriage and a carriage guide of a printer according to a third embodiment of the present invention.
Figure 8B:
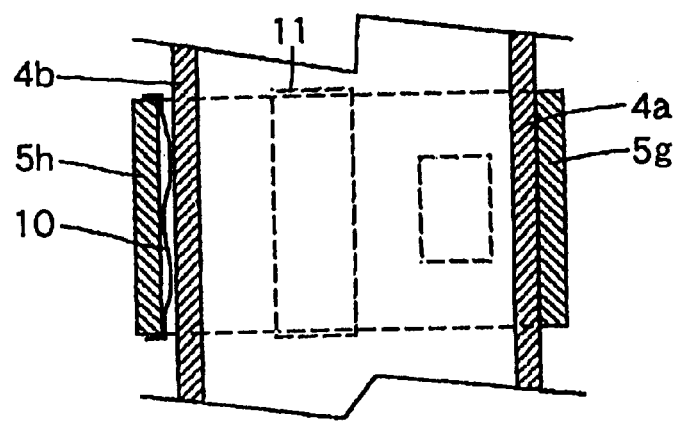
FIG. 8B is a sectional view taken along the line IVb—IVb of FIG. 8A.

Next, a printer as a third embodiment of the present invention is described. The present embodiment is to attempt to improve the rattle between a carriage and a carriage guide. FIG. 8A is a partial enlarged sectional view illustrating the state of contact of the carriage and the carriage guide. FIG. 8B is a sectional view taken along the line IVb—IVb of FIG. 8A, and FIG. 8C is a sectional view taken along the line IVc—IVc of FIG. 8A.

As shown in FIG. 8A, a carriage guide 4' is provided like a channel with highly accurate straightness, and ribs 4a and 4b on both sides are held by channel portions 5g and 5h on both sides of a carriage 5'. Abrasion resistant coating with a small coefficient of friction such as Teflon, fluorine contained resin, or the like is formed on sliding surfaces of one rib 4a of the carriage guide 4' and of one channel portion 5g of the carriage 5', and these surfaces are slidably in contact with each other. Abrasion resistant coating with a small coefficient of friction such as Teflon, fluorine contained resin, or the like is also formed on a side surface of the other rib 4b of the carriage guide 4'. Further, a gap is provided between the rib 4b and the other channel portion 5h of the carriage 5' facing the rib 4b. As shown in FIG. 8B, a plate spring 10 made of stainless steel and bent like two mountains is fixed to the channel portion 5h and is inserted in the gap. Since the plate spring 10 is slidably in contact with the surfaces forming the gap, the rattle of the carriage 5' in the direction orthogonal with the scanning direction is absorbed.

Figure 8C:
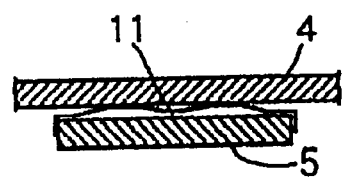
FIG. 8C is a sectional view taken along the line IVc—IVc of FIG. 8A.

Further, as shown in FIG. 8C, abrasion resistant coating with a small coefficient of friction such as Teflon, fluorine contained resin, or the like is also formed on a lower surface of the carriage guide 4'. In addition, a groove is dug in a surface of the carriage 5' facing the lower surface of the carriage guide 4', and a plate spring 11 made of stainless steel is attached there. Since the plate spring 11 is slidably in contact with the carriage guide 4', the vertical rattle of the carriage 5' is absorbed.

It is to be noted that although, in this embodiment, steps are taken with regard to both the rattle in the direction orthogonal with the scanning direction and the rattle in the bertical direction, it may be structured to take steps with regard to either of the two as the need arises.

Fourth Embodiment

Figure 9A:
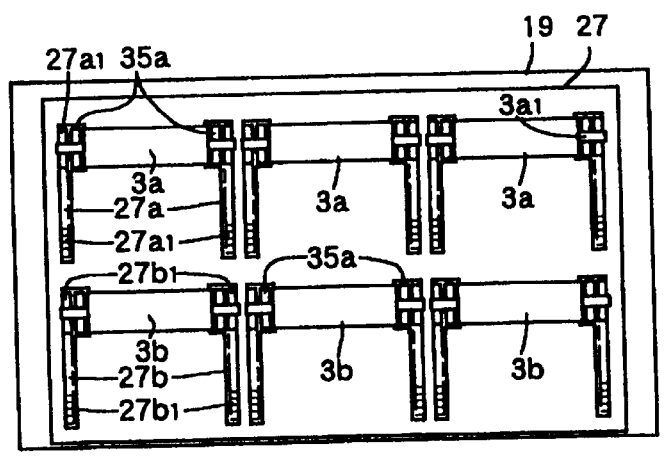
FIG. 9A is a plan view of a supporting structure portion of pinch rollers of a printer according to a fourth embodiment of the present invention.
Figure 9B:
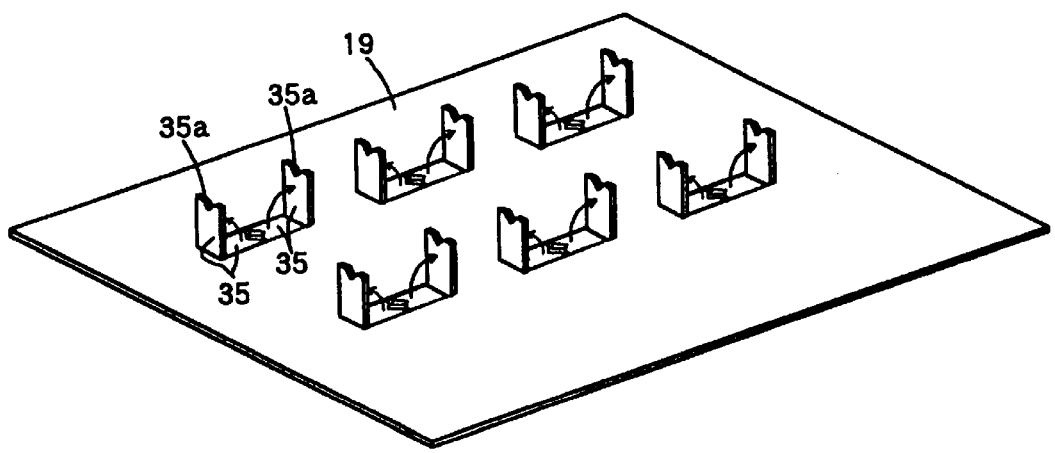
FIG. 9B is a perspective view of bearing portions of the pinch rollers provided on a chassis.
Figure 9C:
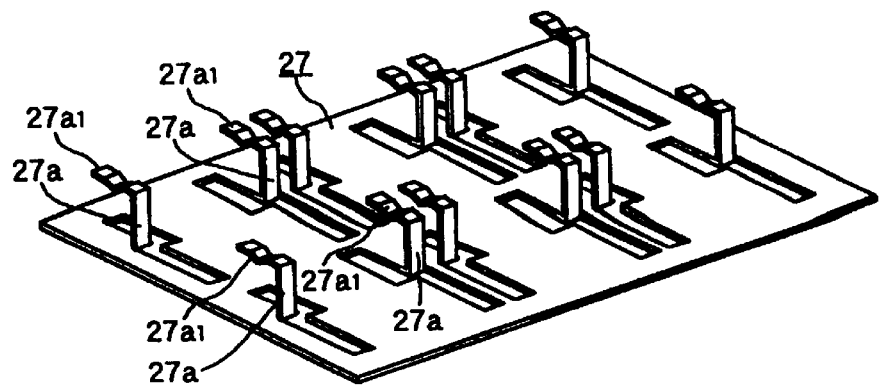
FIG. 9C is a perspective view of a spring plate made of metal.

Next, a printer as a fourth embodiment of the present invention is described. The present embodiment is to attempt to make simpler bearings of the pinch rollers. FIG. 9A is a plan view of a supporting structure portion of pinch rollers. FIG. 9B is a perspective view of the bearing portions of the pinch rollers. FIG. 9C is a perspective view of a spring plate made of metal.

As shown in FIG. 9A, the pinch rollers are formed of the first pinch rollers 3a and the second pinch rollers 3b each of which is formed by disposing independent three roller coaxially with each other. In each of the rollers, the shaft and the roller is integrally formed. Structure of the pinch rollers 3a and 3b is the same as that of the first embodiment. These pinch rollers 3a and 3bare supported by bearing portions 35a and plate spring receiving portions 27a1 and 27b1.

The bearing portions 35a are, as shown in FIG. 9B, provided with notches for bearing at tips of peninsula-shaped portions 35 lifted up from a bottom surface portion of the chassis 19. The plate spring receiving portions 27a1 and 27b1 are, as shown in FIG. 9C, formed by bending horizontally upper end portions of peninsula-shaped plate springs 27a and 27b lifted up from a spring plate member 27 made of metal and further bending the horizontal portions. The spring plate member 27 made of metal is further provided with slits through which the bearing portions 35a pierce.

As shown in FIG. 9A, the spring plate member 27 made of metal is put on the bottom surface portion of the chassis 19 with the bearing portions 35a piercing the slits. The respective pinch rollers 3a and 3b are supported by the bearing portions 35a and the plate spring receiving portions 27a1 and 27b1. The respective pinch rollers 3a and 3b are supported being pressed upward by the plate spring receiving portions 27a1 and 27b1.

It is clear that, in case the number of the rollers forming the pinch rollers 3a and 3b is different from that of the present embodiment, the bearing portions 35a and the plate spring receiving portions 27a1 and 27b1 are provided so as to be suitable for that number.

In this way, if the pinch rollers 3a and 3b are borne by the bearing portions and are pressed upward by the springs, the number of parts necessary decreases, the assembling becomes easier, and the manufacturing cost can be greatly decreased.

Fifth Embodiment

Figure 10A:
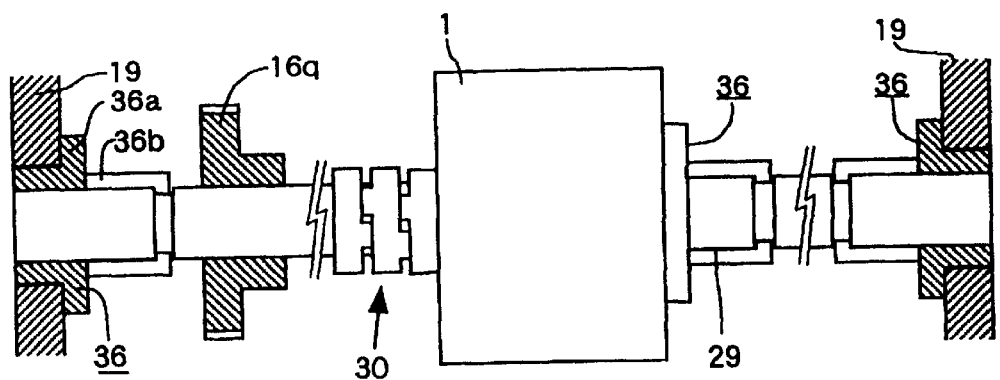
FIG. 10A is a partial sectional view showing a structure of attaching a pickup roller of a printer according to a fifth embodiment of the present invention.
Figure 10B:
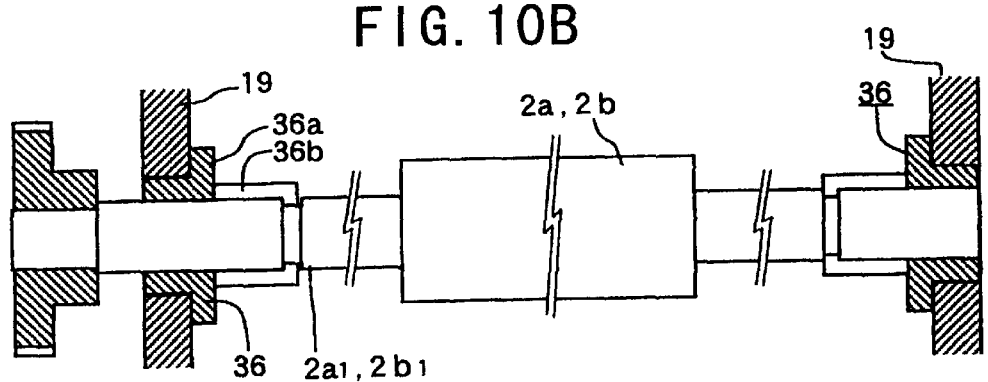
FIG. 10B is a partial sectional view showing the structure of attaching shafts of feed rollers.

Next, a printer as a fifth embodiment of the present invention is described. The present embodiment is to attempt to assemble easier the bearings of the pickup roller and of the feed rollers. FIG. 10A is a partial sectional view illustrating a structure of attaching the shaft 29 of the pickup roller 1, FIG. 10B is a partial sectional view illustrating a structure of attaching shafts 2a1 and 2b1 of the feed rollers 2a and 2b, and FIG. 10C is a perspective view of a cylindrical bearing 36 used in these bearing structures.

Figure 10C:
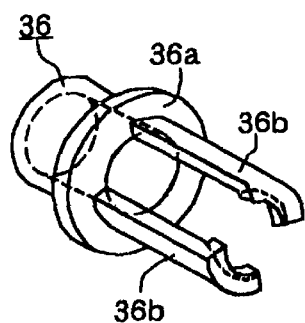
FIG. 10C is a perspective view of a cylindrical bearing used in these bearing structures.

As shown in FIG. 10A, the cylindrical bearing 36 shown in FIG. 10C is put on the shaft 29 of the pickup roller 1 and on the shafts 2a1 and 2b1 of the feed rollers 2a and 2b, respectively. Further, the cylindrical bearings 36 are inserted into bearing containing portions provided in the chassis 19.

The cylindrical bearing 36 is made by molding plastic. The cylindrical bearing 36 has a flange 36a in contact with the chassis 19, and a pair of L-shaped claws 36b. A groove is formed in a circumferential direction at both ends of the shaft 29 or the shafts 2a1 and 2b1, and the claws 36b are attached so as to fit into the groove and so as not to move in the axial direction. Therefore, when the cylindrical bearings 36 are attached to the chassis 19, the shaft 29 or the shafts 2a1 and 2bl are attached so as not to move in the axial direction.

The claws 36b of the cylindrical bearing 36 can be opened to some extent by being flexed. Therefore, when the shaft 29 or the shafts 2a1 and 2b1 are attached to the chassis 19, first, the shaft is inserted into the bearing containing portion in the chassis without the claws 36b being fitted into the groove in the shaft and with the cylindrical bearing 36 being slided inward of the shaft, and then, the cylindrical bearing 36 is inserted into the bearing containing portion, and the claws 36b are made to fit into the groove in the shaft for fixing.

It is to be noted that, instead of the cylindrical bearing structured as described in the above, a cylindrical bearing having only the flange 36a may be used. In this case, the end of the shaft on the side where the cylindrical bearing having only the flange 36a is attached is structured to have a difference in diameter.

Sixth Embodiment

Figure 11:
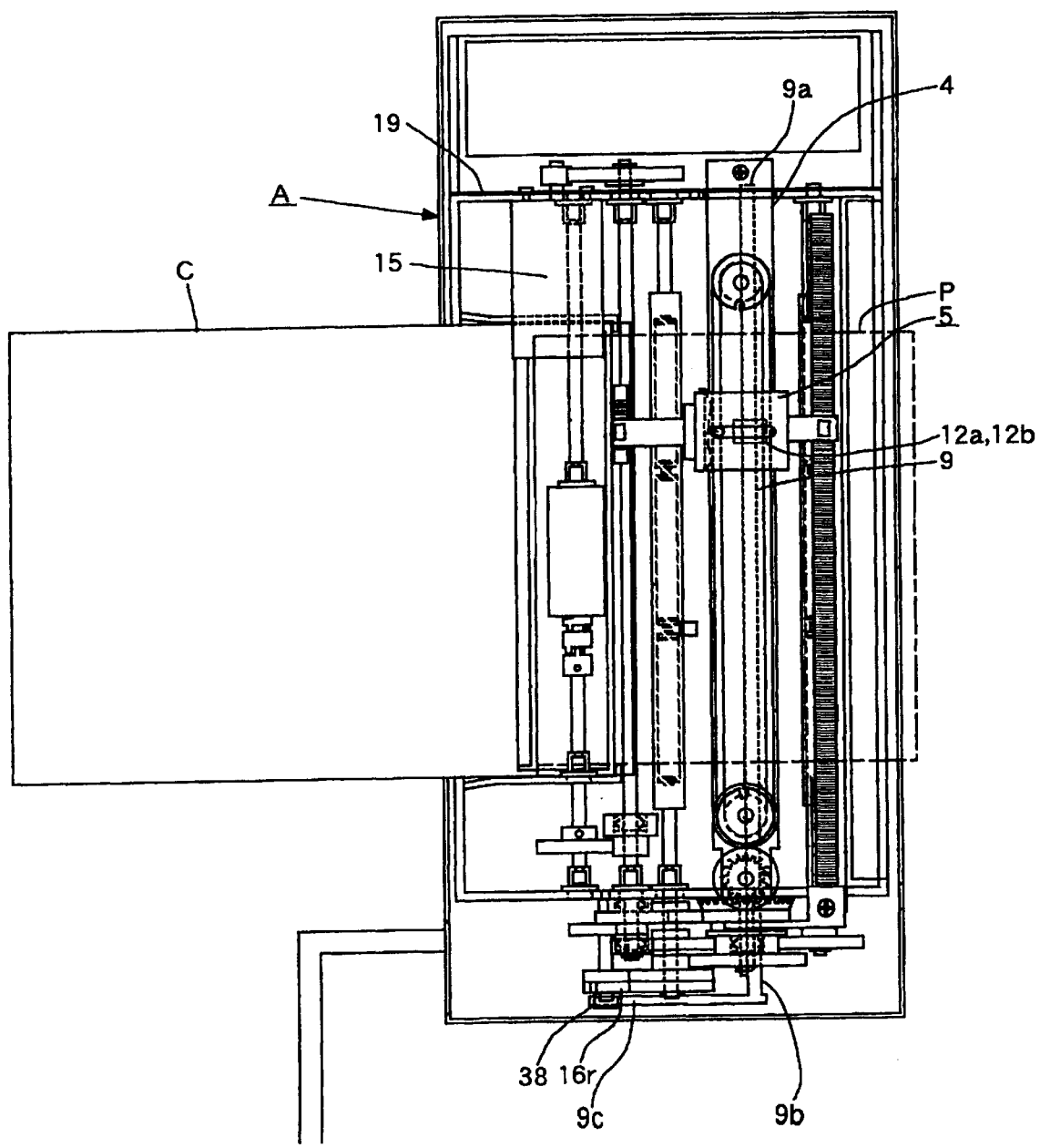
FIG. 11 is a plan view illustrating a printer and a printing system according to a sixth embodiment of the present invention.

Previously, an embodiment where the rolling roller is lifted a little due to the necessity of sending the print paper while the carriage makes a U-turn at both ends of the carriage guide was described. In the present embodiment, a structure for carrying out this operation is described. FIG. 11 is a plan view illustrating a printer as a sixth embodiment of the present invention.

The platen 9 is axially supported such that its end portion 9a closer to the motor 15 rotates or swings in a plane vertical to the chassis 19. A cam-follower 9c extends from the other end portion 9b opposite to the motor 15, and presses a cam 38 provided integrally with the Geneva gear 16r from below. When the cam 38 presses down the cam-follower 9c, the platen 9 also goes down, and thus, the platen 9 goes away from the rolling roller 12a.

When the carriage 5 approaches either end of the carriage guide 4, the Geneva gear 16r acts to send the print paper P. Here, at the same time, the cam 38 presses down the cam-follower 9c to make the platen 9 go down. The point where the platen 9 goes is set to be, for example, 5 mm before the end portion. On the contrary, when the carriage 5 goes away from the end portion, the cam 38 is released from pressing down the cam-follower 9c, and the platen 9 pressed from below by the spring 28 goes up. In this way, the carriage 9 is adapted to go down when it makes a U-turn in its reciprocation.

The respective embodiments of a printer according to the present invention are described in the above, but the present invention is not intended to be limited thereto. For example, the following fall within the scope of the present invention.

(1) An exposure means is formed by attaching a light emitting device to a carriage which moves to scan in a direction orthogonal to a sending direction of print paper.

(2) An exposure means may adopt a pulsed laser oscillator to make pulsed laser light scan in a direction orthogonal to the sending direction of print paper using a galvanomirror or a polygon mirror thereby flickeringly applying light to print paper.

(3) An exposure means may adopt a laser oscillator for continuously oscillating laser light. By passing laser light through a crystal like tellurium of a polarizer and by applying a sound wave signal corresponding to image data to a sound wave electrode provided on a side surface of the crystal, the laser is selectively polarized, and the laser light rectilinearly propagating through the crystal is made to flicker corresponding to the image data. Further, pulsed laser light is made to scan in a direction orthogonal to the sending direction of print paper using a galvanomirror or a polygon mirror. In this way, light is flickeringly applied to print paper.

(4) An exposure means may adopt a light emitting body elongated in a direction orthogonal to the sending direction of print paper and a liquid crystal shutter which opens and closes correspondingly to image data.

(5) A printing method and a printer according to the present invention which specifies the kind of print paper by reading a code attached to a cassette inserted into a chassis and which varies the intensity or the time period of emission of the light of specific wavelength according to the kind of the print paper may be applied to a cassette which contains a stack of conventional print paper.

(6) A heating means may be a roll heater instead of a bar heater.

As described in the above, according to a printer using print paper with photosensitive microcapsules applied thereto according to the present invention, an image can be developed by forming a latent image by applying light over print paper with photosensitive microcapsules applied thereto so as to correspond to image data inputted from the external and applying high pressure to the print paper with the latent image formed thereon thus collapsing microcapsules and making color developing material in the collapsed microcapsules in contact with image receiving layer.

Since, in print paper with photosensitive microcapsules applied thereto used in a printer according to the present invention, a film with microcapsules applied thereto and a sheet paper with an image receiving layer applied thereto are laminated to each other, it is not necessary to, as in a conventional printer, supply and wind separately a film with microcapsules applied thereto and a sheet paper with an image receiving layer applied thereto, and thus, a printer can be ultraminiaturized to be palm top.

Further, in a printer according to the present invention, a pressurizing means for developing print paper with a latent image formed thereon is a rolling roller provided on a carriage and the rolling roller pressurizes print paper during the carriage reciprocates. Since the pressurization is carried out via point contact, even if large force does not act on the pressurizing means itself, the print paper can be pressurized with sufficiently high pressure. This makes it enough for a supporting structure of the printer to bear only a light load, which also makes it possible to miniaturize the printer.

Further, in a printer according to the present invention, a cassette for containing print paper is provided, the cassette is provided with a code indicating the kind of the print paper such as photosensitive characteristics of the print paper, the code is read by a sensor, and emission of light applied to the print paper is controlled based on the information read with regard to the print paper. Therefore, with the printer, even if all the print paper in the cassette is not spent, the cassette can be freely exchanged for printing.

Further, a printer according to the present invention is provided with a heating means for heating print paper during developing. Since reaction of the color developing material in the microcapsules with the image receiving layer is accelerated by heating, the developing time can be shortened.

Further, a printer according to the present invention is provided with paper guides which is substantially as thick as the print paper for sandwiching and sending the print paper. Therefore, even if the rolling roller comes out of the print paper and again steps onto the print paper, since the rolling roller steps onto and steps off the paper guides, an impact due to pressurization is not applied to the print paper, and thus, blur of an image can be prevented and noise caused during printing can be suppressed.

Further, a printer according to the present invention is structured such that, when the print paper is not on the platen, the space between the pressure roller and the platen is about a half of the thickness of the print paper. Therefore, when the print paper is not on the platen, since the rolling roller is away from the platen, there is no noise caused by the rolling of the rolling roller.

Further, a printer according to the present invention is provided with two rolling rollers. Therefore, the two rolling rollers smoothly roll, high-speed movement of the rolling rollers can be secured, and in particular, when the diameter of a rolling roller which is brought into contact with the print paper is larger, noise caused when this rolling roller transfers from the print roller to a paper guide and the like can be suppressed further.

Further, a printer according to the present invention adopts bevel gears in a train of gears for driving the carriage, and the back surface of a driving side bevel gear is supported by a bracket for preventing bevel gear movement. Therefore, even in case the print paper is caught on the carriage and the carriage which has been moving at a high speed comes to a sudden stop, the bevel gears do not disengage, and failure of the power transmitting portion can be avoided.

Further, in a printer according to the present invention, the carriage guide is assembled to the chassis after parts are assembled to the carriage guide in advance. This can make easier the assembling of the printer, and can make lower the manufacturing cost.

Further, in a printer according to the present invention, pinch rollers are made of plastic material. Therefore, the sliding characteristics of the pinch rollers with respect to the print paper are improved, the print paper can be easily put between the feed rollers and the pinch rollers, and therefore, the print paper can be sent smoothly.

Further, in a printer according to the present invention, the carriage is pressed against the carriage guide by a plate spring. Therefore, the rattle in the direction orthogonal with the scanning direction of the carriage or the rattle in the vertical direction can be eliminated, the carriage can be positioned precisely, and thus, lowering of the quality of an image can be prevented.

Further, in a printer according to the present invention, shafts of the pinch rollers are borne by bearing portions lifted up from the chassis and are pressed upward by plate springs lifted up from a plate spring member. Further, the shafts of the pickup roller and the feed rollers are supported by the chassis via cylindrical bearings each having a flange and claws extending therefrom. This can make the structure of the printer simpler, can decrease the number of parts, and can decrease the manufacturing cost.

What is claimed is:

1. A printer comprising:
a printer body;
a cassette removably connected to the printer body for storing print paper containing photosensitive microcapsules encapsulating a color developing material and a photo-curing material and having an image receiving layer for developing color by a reaction of the color developing material with the image receiving layer, the cassette having a code element indicative of photosensitive characteristics of the print paper;
a carriage for undergoinq scanning movement over the print paper in a scanning direction, the carriage having a light emitting element for emitting light of a preselected wavelength to which the photosensitive microcapsules are exposed to thereby form a latent image on the print paper;
a carriage guide for guiding movement of the carriage in the scanning direction, the carriage guide having a first side surface for sliding contact with a side surface of the carriage and a second side surface;
a plate spring disposed on the carriage and in confronting relation with the second side surface of the carriage guide for sliding contact therewith;
an abrasion resistant coating having a low coefficient of friction disposed on the second side surface of the carriage guide;
photosensitive characteristics identifying means disposed on the carriage for reading the code element of the cassette to identify the photosensitive characteristics of the print paper;
light emission controlling means for controlling the intensity or the time period of emission of the light emitted by the light emitting element in accordance with the photosensitive characteristics of the print paper identified by the photosensitive characteristics identifying means; and
pressurizing means for applying mechanical pressure to the print paper after a latent image has been formed thereon to collapse the photosensitive microcapsules which were not exposed to the light emitted by the light emitting element and thereby develop the latent image by reaction of the color developing material in the photosensitive microcapsules with the image receiving layer.

2. A printer comprising:
a printer body;
a cassette removably connected to the printer body for storing print paper containing photosensitive microcapsules encapsulating a color developing material and a photo-curing material and having an image receiving layer for developing color by a reaction of the color developing material with the image receiving layer, the cassette having a code element indicative of photosensitive characteristics of the print paper;
a carriage for undergoing scanning movement over the print paper in a scanning direction, the carriage having a light emitting element for emitting light of a preselected wavelength to which the photosensitive microcapsules are exposed to thereby form a latent image on the print paper;
a carriage guide for guiding movement of the carriage in the scanning direction, the carriage guide having a first side surface for sliding contact with a side surface of the carriage and a second side surface;
a plate spring disposed on the carriage and in confronting relation with the second side surface of the carriage guide for sliding contact therewith;
an abrasion resistant coating having a low coefficient of friction disposed on the second side surface of the carriage guide;
photosensitive characteristics identifying means disposed on the carriage for reading the code element of the cassette to identify the photosensitive characteristics of the print paper;
light emission controlling means for controlling the intensity or the time period of emission of the light emitted by the light emitting element in accordance with the photosensitive characteristics of the print paper identified by the photosensitive characteristics identifying means;
a platen supported by the print body in the scanning direction for guiding the print paper; and
a pressure roller for rolling on the print paper guided on the platen during movement of the carriage in the scanning direction and applying mechanical pressure to the print paper after a latent image has been formed thereon to collapse the photosensitive microcapsules which were not exposed to the light emitted by the light emitting element and thereby develop the latent image by reaction of the color developing material in the photosensitive microcapsules with the image receiving layer.

3. A printer comprising:
a printer body having a print paper receiving section for receiving print paper containing photosensitive microcapsules encapsulating a color developing material and a photo-curing material, the print paper having an image receiving layer for developing color by a reaction of the color developing material with the image receiving layer;
a carriage for undergoing scanning movement over the print paper in a scanning direction, the carriage having a light emitting element for emitting light of a preselected wavelength to which the photosensitive microcapsules are exposed to thereby form a latent image on the print paper;

a carriage guide for guiding movement of the carriage in the scanning direction, the carriage guide having a first side surface for sliding contact with a side surface of the carriage and a second side surface;

a plate spring disposed on the carriage and in confronting relation with the second side surface of the carriage guide for sliding contact therewith;

an abrasion resistant coating having a low coefficient of friction disposed on the second side surface of the carriage guide; and pressurizing means for applying mechanical pressure to the print paper after a latent image has been formed thereon to collapse the photosensitive microcapsules which were not exposed to the light emitted by the light emitting element and thereby develop the latent image by reaction of the color developing material in the photosensitive microcapsules with the image receiving layer.

4. A printing system comprising: a printer as claimed in claim 3; an external device for providing data representative of an image to be printed; and means responsive to the data for transmitting a signal to the printer to enable the printer to print the image on the print paper.

5. A printer comprising:

a printer body having a print paper receiving section for receiving print paper containing photosensitive microcapsules encapsulating a color developing material and a photo-curing material, the print paper having an image receiving layer for developing color by a reaction of the color developing material with the image receiving layer;

a carriage for undergoing scanning movement over the print paper in a scanning direction, the carriage having a light emitting element for emitting light of a preselected wavelength to which the photosensitive microcapsules are exposed to thereby form a latent image on the print paper;

a carriage guide for guiding movement of the carriage in the scanning direction, the carriage guide having a first side surface for sliding contact with a side surface of the carriage and a second side surface;

a platen supported by the print body in the scanning direction for guiding the print paper;

a plate spring disposed on the carriage and in confronting relation with the second side surface of the carriage guide for sliding contact therewith;

an abrasion resistant coating having a low coefficient of friction disposed on the second side surface of the carriage guide; and a pressure roller for rolling on the print paper guided on the platen during movement of the carriage in the scanning direction and applying mechanical pressure to the print paper after a latent image has been formed thereon to collapse the photosensitive microcapsules which were not exposed to the light emitted by the light emitting element and thereby develop the latent image by reaction of the color developing material in the photosensitive microcapsules with the image receiving layer.

6. A printing system comprising: a printer as claimed in claim 5; an external device for providing data representative of an image to be printed; and means responsive to the data for transmitting a signal to the printer to enable the printer to print the image on the print paper.

7. A printer comprising:

a printer body;

a cassette removably connected to the printer body for storing print paper containing photosensitive microcapsules encapsulating a color developing material and a photo-curing material and having an image receiving layer for developing color by a reaction of the color developing material with the image receiving layer, the cassette having a code element indicative of photosensitive characteristics of the print paper;

a pick-up roller for feeding the print paper from the cassette;

a feed roller for feeding the print paper fed by the pick-up roller;

a pinch roller disposed below the feed roller for pinching and feeding the print paper;

a chassis connected to the printer body and having a bearing portion;

a generally plate-shaped spring member having a spring portion and slit for receiving the bearing portion of the chassis so that the bearing portion and the spring portion rotationally support the pinch roller;

a motor for rotating the pick-up roller and the feed roller;

power transmitting means for transmitting rotation of the motor to the pick-up roller and the feed roller;

a carriage for undergoing scanning movement over the print paper in a scanning direction, the carriage having a light emitting element for emitting light of a preselected wavelength to which the photosensitive microcapsules are exposed to thereby form a latent image on the print paper;

a carriage guide for guiding movement of the carriage in the scanning direction; and pressurizing means for applying mechanical pressure to the print paper after a latent image has been formed thereon to collapse the photosensitive microcapsules which were not exposed to the light emitted by the light emitting element and thereby develop the latent image by reaction of the color developing material in the photosensitive microcapsules with the image receiving layer.

8. A printing system comprising: a printer as claimed in claim 7; an external device for providing data representative of an image to be printed; and means responsive to the data for transmitting a signal to the printer to enable the printer to print the image on the print paper.

9. A printer comprising:

a printer body;

a cassette removably connected to the printer body for storing print paper containing photosensitive microcapsules encapsulating a color developing material and a photo-curing material and having an image receiving layer for developing color by a reaction of the color developing material with the image receiving layer, the cassette having a code element indicative of photosensitive characteristics of the print paper;

a pick-up roller for feeding the print paper from the cassette;

a feed roller for feeding the print paper fed by the a motor for rotating the pick-up roller and the feed roller;

power transmitting means for transmitting rotation of the motor to the pick-up roller and the feed roller;

a bearing member for receiving a shaft of one of the pick-up roller and the feed roller, the bearing member having a flange and a plurality of claw members extending from the flange for engaging a circumferential groove formed in the shaft;

a chassis connected to the printer body and having a surface and a bearing hole disposed in the surface for receiving the bearing member so that the flange of the bearing member engages the surface of the chassis and the shaft is rotatably supported by the chassis;

a carriage for undergoing scanning movement over the print paper in a scanning direction, the carriage having a light emitting element for emitting light of a preselected wavelength to which the photosensitive microcapsules are exposed to thereby form a latent image on the print paper;

a carriage guide for guiding movement of the carriage in the scanning direction; and pressurizing means for applying mechanical pressure to the print paper after a latent image has been formed thereon to collapse the photosensitive microcapsules which were not exposed to the light emitted by the light emitting element and thereby develop the latent image by reaction of the color developing material in the photosensitive microcapsules with the image receiving layer.

10. A printing system comprising: a printer as claimed in claim 9; an external device for providing data representative of an image to be printed; and means responsive to the data for transmitting a signal to the printer to enable the printer to print the image on the print paper.

* * * * *